US009048221B2

(12) United States Patent
Hasegawa et al.

(10) Patent No.: US 9,048,221 B2
(45) Date of Patent: Jun. 2, 2015

(54) DEVICE HAVING ELECTRODES FORMED FROM BUMPS WITH DIFFERENT DIAMETERS

(71) Applicant: PS4 Luxco S.a.r.l., Luxembourg (LU)

(72) Inventors: Yu Hasegawa, Tokyo (JP); Mitsuaki Katagiri, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/671,033

(22) Filed: Nov. 7, 2012

(65) Prior Publication Data

US 2013/0127048 A1   May 23, 2013

(30) Foreign Application Priority Data

Nov. 17, 2011   (JP) .................. 2011-251560

(51) Int. Cl.
*H01L 23/498* (2006.01)
*H01L 23/48* (2006.01)
(Continued)

(52) U.S. Cl.
CPC ..... *H01L 23/481* (2013.01); *H01L 2224/32225* (2013.01); *H01L 2224/73204* (2013.01); *H01L 2924/15311* (2013.01); *H01L 23/49816* (2013.01); *H01L 23/49838* (2013.01); *H01L 21/561* (2013.01); *H01L 21/563* (2013.01); *H01L 25/0657* (2013.01); *H01L 23/3128* (2013.01); *H01L 24/11* (2013.01); *H01L 24/14* (2013.01); *H01L 24/97* (2013.01); *H01L 2224/14517* (2013.01); *H01L 2224/16145* (2013.01); *H01L 2224/32145* (2013.01); *H01L 2224/97* (2013.01); *H01L 2225/06517* (2013.01); *H01L 2225/06513* (2013.01); *H01L 2225/06541* (2013.01); *H01L 2224/14155* (2013.01); *H01L 2224/13005* (2013.01); *H01L 2224/14156* (2013.01); *H01L 2224/1415* (2013.01); *H01L 24/05* (2013.01); *H01L 24/06* (2013.01); *H01L 24/13* (2013.01); *H01L 24/16* (2013.01); *H01L 24/17* (2013.01); *H01L 24/81* (2013.01); *H01L 2224/05567* (2013.01); *H01L 2224/0557* (2013.01); *H01L 2224/05599* (2013.01); *H01L 2224/06102* (2013.01); *H01L 2224/1147* (2013.01); *H01L 2224/11849* (2013.01);
(Continued)

(58) Field of Classification Search
CPC ......... H01L 23/48; H01L 23/58; H01L 23/52; H01L 23/29; H01L 23/28; H01L 23/498; H01L 23/488; H01L 29/40
USPC .......... 257/737, 738, 778, E23.068, 780, 783, 257/786, 698, 696, 692, 691, 693
See application file for complete search history.

(56) References Cited

U.S. PATENT DOCUMENTS 5,556,670 A * 9/1996 Mihara et al. .................. 428/1.5
6,287,895 B1 * 9/2001 Sato .............................. 438/114
(Continued)

FOREIGN PATENT DOCUMENTS

JP   2000-195900 A    7/2000
JP   2000-243785 A    9/2000
JP   2003-309140      * 10/2003

*Primary Examiner* — Alexander Oscar Williams

(57) ABSTRACT

A device has a first substrate having a first surface; a first electrode pad arranged on the first surface of the first substrate; a first insulator film provided on the first surface of the first substrate so that the first electrode pad is exposed; a first bump electrode provided on the first electrode pad and having a first diameter; and a second bump electrode provided on the first insulator film and having a second diameter smaller than the first diameter.

16 Claims, 17 Drawing Sheets

(51) Int. Cl.
  *H01L 21/56* (2006.01)
  *H01L 25/065* (2006.01)
  *H01L 23/31* (2006.01)
  *H01L 23/00* (2006.01)

(52) U.S. Cl.
  CPC ........... *H01L2224/13014* (2013.01); *H01L 2224/13021* (2013.01); *H01L 2224/13023* (2013.01); *H01L 2224/13025* (2013.01); *H01L 2224/13082* (2013.01); *H01L 2224/131* (2013.01); *H01L 2224/13147* (2013.01); *H01L 2224/1403* (2013.01); *H01L 2224/14181* (2013.01); *H01L 2224/16227* (2013.01); *H01L 2224/81191* (2013.01); *H01L 2224/81815* (2013.01); *H01L 2224/83102* (2013.01); *H01L 2224/14135* (2013.01); *H01L 2224/14177* (2013.01); *H01L 2924/00013* (2013.01); *H01L 2224/16225* (2013.01)

(56) References Cited

U.S. PATENT DOCUMENTS

| | | | |
|---|---|---|---|
| 6,740,190 B2 * | 5/2004 | Takase | 156/267 |
| 7,323,675 B2 * | 1/2008 | Chen | 250/214.1 |
| 7,449,716 B2 * | 11/2008 | Chen et al. | 257/48 |
| 7,576,430 B2 * | 8/2009 | Chang et al. | 257/738 |
| 2002/0075438 A1 * | 6/2002 | Takase | 349/149 |
| 2004/0046252 A1 * | 3/2004 | Fujimori et al. | 257/734 |
| 2009/0008801 A1 * | 1/2009 | Lai et al. | 257/782 |
| 2012/0129333 A1 * | 5/2012 | Yim et al. | 438/613 |
| 2013/0069229 A1 * | 3/2013 | Kang et al. | 257/737 |

* cited by examiner

DEVICE HAVING ELECTRODES FORMED FROM BUMPS WITH DIFFERENT DIAMETERS

This application is based upon and claims the benefit of priority from Japanese patent application No. 2011-251560, filed on Nov. 17, 2011, the disclosure of which is incorporated herein in its entirety by reference.

BACKGROUND OF THE INVENTION

The present invention relates to a semiconductor chip and a semiconductor device.

JP-A 2000-195900 (Patent Literature 1) discloses a semiconductor device having a circuit board and a semiconductor chip mounted on the circuit board via an anisotropic conductive jointing material. The circuit board has circuit electrodes formed on an upper surface thereof. The semiconductor chip has function bumps formed on a lower surface thereof. The function bumps are located at positions corresponding to the circuit electrodes. The semiconductor chip also has dummy bumps formed on the lower surface thereof for distributing loads applied to the semiconductor chip.

If electrode pads for those dummy bumps are provided, the semiconductor chip may be increased in size. In order to avoid such a drawback, the dummy bumps are formed on a passivation film (insulator film), which is formed on the semiconductor chip.

JP-A 2000-243785 (Patent Literature 2) discloses a method of manufacturing a semiconductor chip that includes flattening a surface protective film, then forming openings in the surface protective film at locations at which function bumps are to be formed, and forming function bumps in the openings and dummy bumps on the protective film, respectively.

SUMMARY

When the function bumps and the dummy bumps are formed on different layers by the same process, tops of those bumps may be located at different heights. Generally, the tops of the dummy bumps formed on the surface protective film are located higher than the tops of the function bumps formed in the openings of the surface protective film.

If the semiconductor chip is mounted on a wiring substrate in a state in which the tops of the dummy bumps are located higher than the tops of the function bumps, gaps are produced between the function bumps and the wiring substrate when the dummy bumps are brought into contact with the wiring substrate. If the semiconductor chip and the wiring substrate are connected to each other by a flip chip process, the amount of solder may be insufficient for those gaps. In such a case, the solder may have a constricted portion or cause a defective connection.

Thus, if the tops of the dummy bumps and the function bumps are located at different heights, it is difficult to connect the function bumps to the wiring substrate satisfactorily. Therefore, the reliability of electric connection is problematically low in such a case.

Furthermore, the method of manufacturing a semiconductor chip as disclosed in Patent Literature 2 additionally requires a process of flattening a surface protective film. Therefore, the number of processes and the manufacturing cost are problematically increased.

A semiconductor chip of a preferred embodiment includes a first substrate having a first surface. A first electrode pad is arranged on the first surface of the first substrate. A first insulator film is provided on the first surface of the first substrate so that the first electrode pad is exposed. A first bump electrode is provided on the first electrode pad and has a first diameter. A second bump electrode is provided on the first insulator film and has a second diameter smaller than the first diameter.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Embodiments of the present invention will be described below in detail with reference to the accompanying drawings. Those skilled in the art will recognize that many alternative embodiments can be accomplished using the teachings of the present invention and that the invention is not limited to the embodiments illustrated for explanatory purposes.

The drawings referred to in the following description are provided to explain embodiments of the present invention. Therefore, the size, thickness, dimension, and the like of the illustrated components may be different from those of actual components in a semiconductor chip and a semiconductor device.

(First Embodiment)

Figure 1:
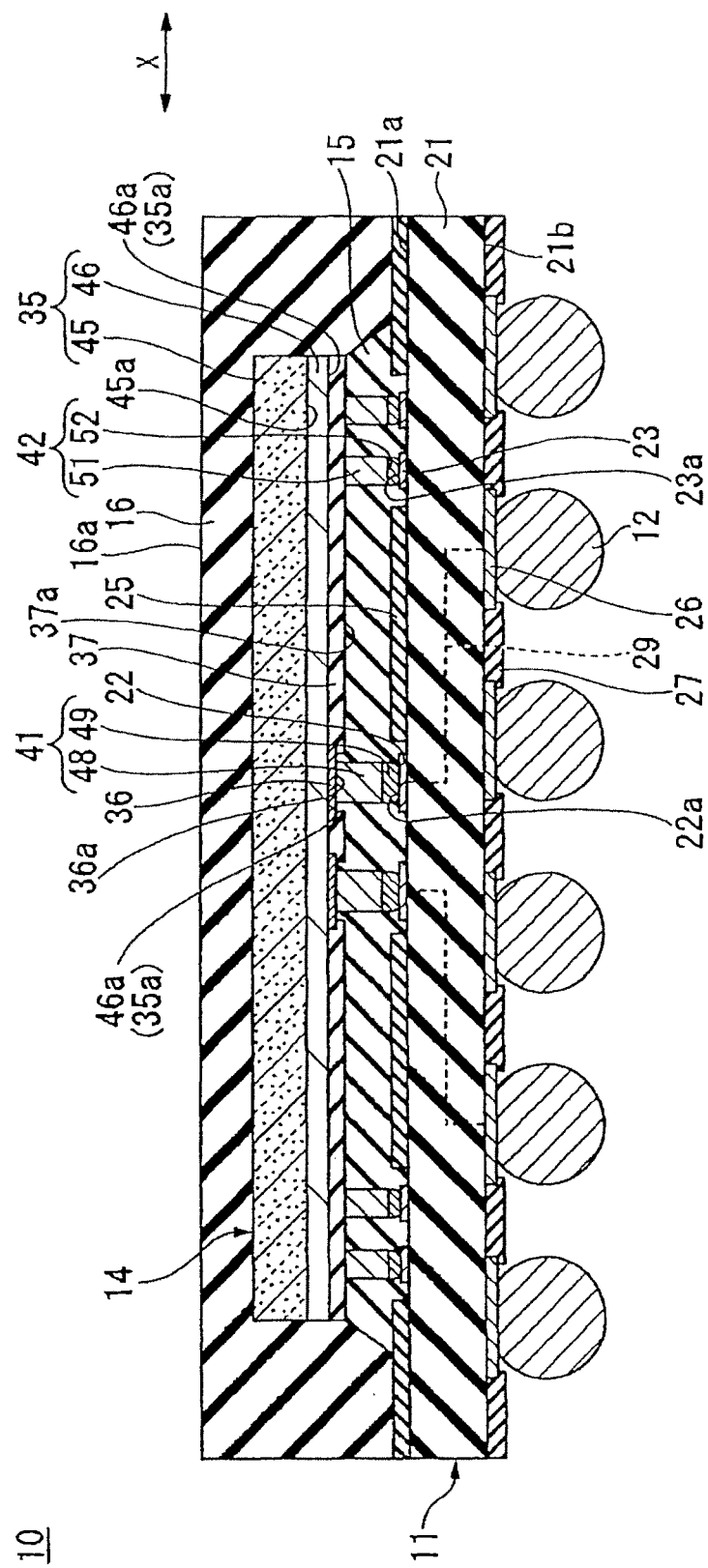
FIG. 1 is a cross-sectional view showing a semiconductor device according to a first embodiment of the present invention.

FIG. 1 is a cross-sectional view showing a semiconductor device 10 according to a first embodiment of the present invention.

Referring to FIG. 1, the semiconductor device 10 according to the first embodiment includes a wiring substrate 11, external connection terminals 12, a semiconductor chip 14, a first sealing resin 15, and a second sealing resin 16.

The wiring substrate 11 includes a substrate body 21, first connection pads 22, second connection pads 23, a first solder resist 25, external connection pads 26, a second solder resist 27, and wiring patterns 29.

The substrate body 21 is in the form of a plate and has a first surface 21a and a second surface 21b, which are flat. For example, a glass epoxy substrate having a thickness of 0.2 mm may be used for the substrate body 21.

The first connection pads 22 are connected to first bump electrodes 41 of the semiconductor chip 14. The first connection pads 22 face the first bump electrodes 41 of the semiconductor chip 14. Each of the first connection pads 22 has a mount surface 22a to be connected to the corresponding first bump electrode 41.

Most of the first connection pads 22 are provided at a central area of the first surface 21a of the substrate body 21. Those first connection pads 22 are arranged in one or more rows (two rows in the first embodiment) along the Y-direction (see FIG. 2) perpendicular to the X-direction.

Some of the first connection pads 22 (not shown) are provided at a peripheral area of the first surface 21a of the substrate body 21.

The second connection pads 23 are provided at a peripheral area of the first surface 21a of the substrate body 21 so as to face second bump electrodes 42 arranged at a peripheral area of the semiconductor chip 14. The second connection pads 23 face the second bump electrodes 42 of the semiconductor chip 14. Each of the second connection pads 23 has a mount surface 23a to be connected to the corresponding second bump electrode 42.

The first solder resist 25 is provided on the first surface 21a of the substrate body 21 so as to expose the first and second connection pads 22 and 23. The first solder resist 25 has openings for exposing the first and second connection pads 22 and 23.

The external connection pads 26 are provided on the second surface 21b of the substrate body 21, which is located opposite to the first surface 21a of the substrate body 21.

The second solder resist 27 is provided on the second surface 21b of the substrate body 21 so as to expose the external connection pads 26. The second solder resist 27 has openings for exposing the external connection pads 26.

The wiring patterns 29 are provided within the substrate body 21. Each of the wiring patterns 29 has a first end connected to the first connection pad 22 and a second end connected to the external connection pad 26. Thus, the wiring patterns 29 electrically connect the first connection pads 22 and the external connection pads 26 to each other.

The external connection terminals 12 are provided on the external connection pads 26. The external connection terminals 12 are electrically connected to the first connection pads 22 via the external connection pads 26. For example, solder balls may be used for the external connection terminals 12.

Figure 2:
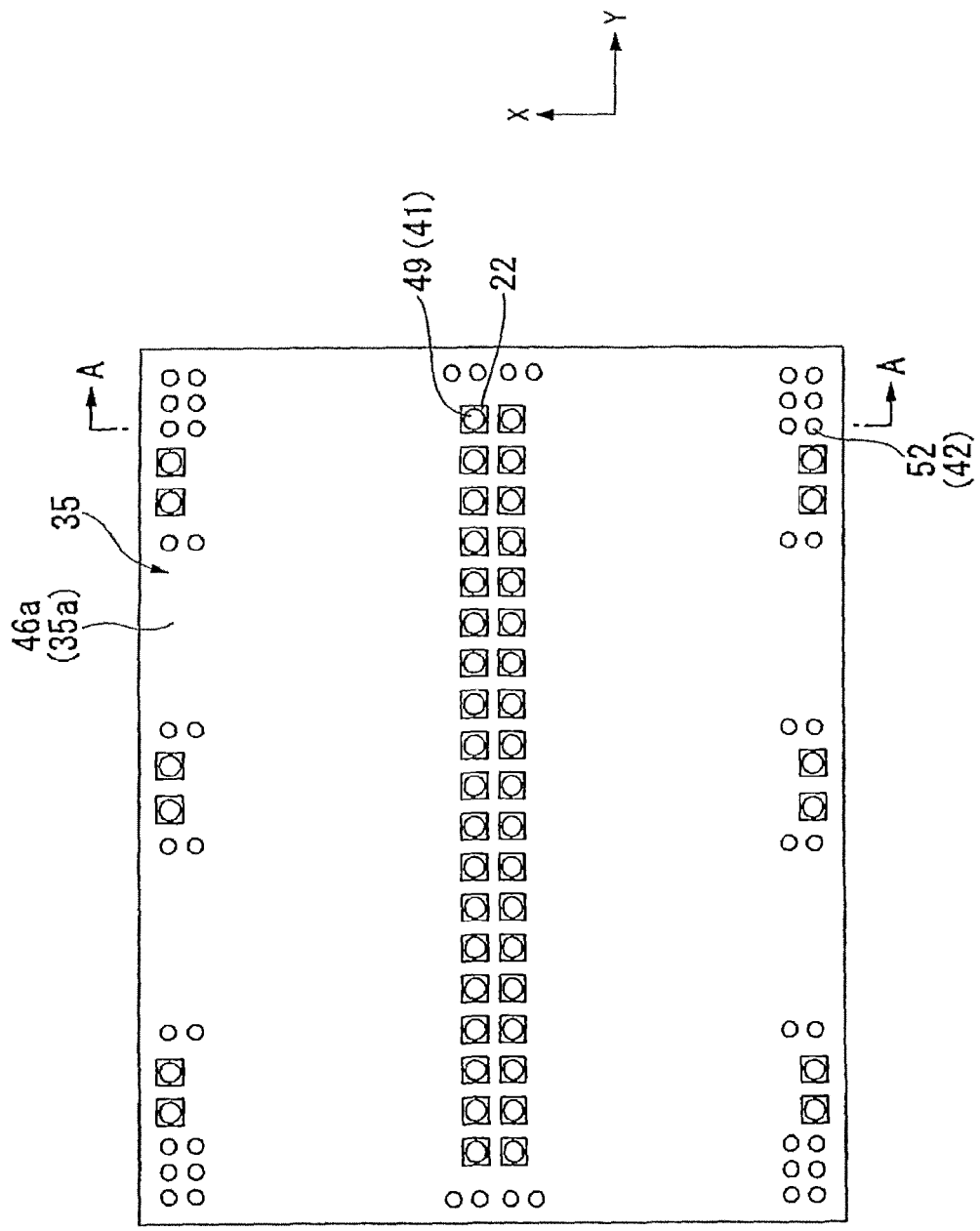
FIG. 2 is a plan view of a semiconductor chip before the semiconductor chip is inverted and mounted on a wiring substrate as shown in FIG. 1.
Figure 3:
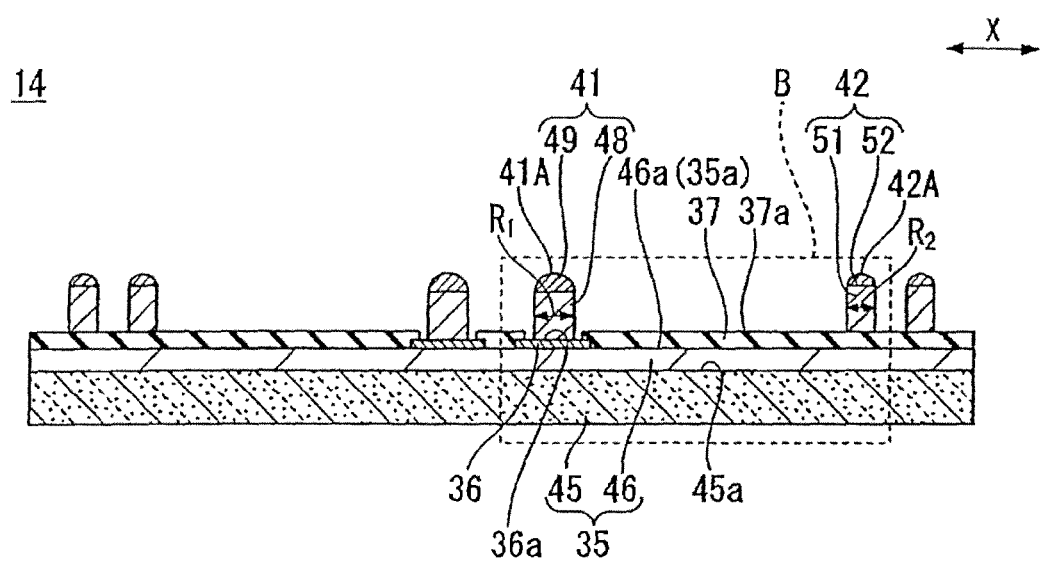
FIG. 3 is a cross-sectional view of the semiconductor chip taken along line A-A of FIG. 2.
Figure 4:
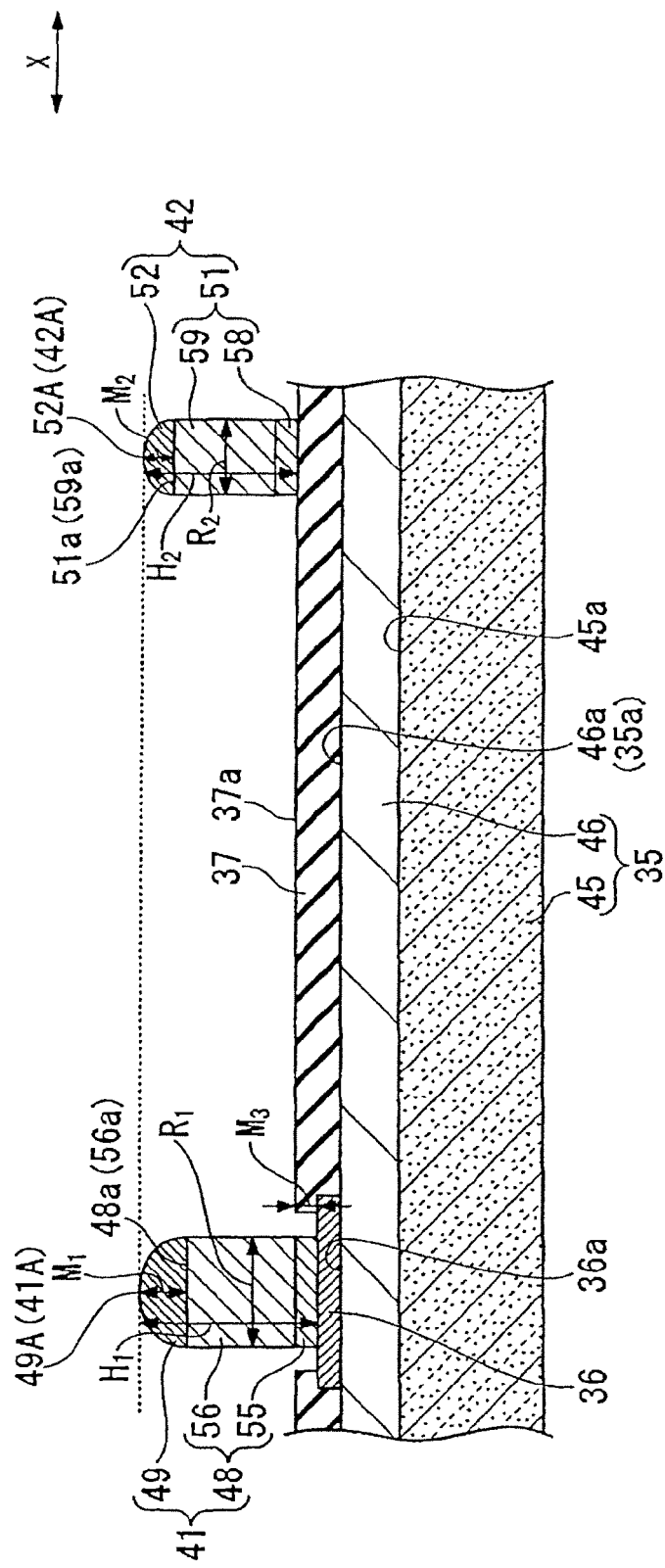
FIG. 4 is an enlarged cross-sectional view showing region B of FIG. 3.

FIG. 2 is a plan view of the semiconductor chip 14 before the semiconductor chip 14 is inverted and mounted on the wiring substrate 11. FIG. 3 is a cross-sectional view of the semiconductor chip 14 taken along line A-A of FIG. 2. FIG. 4 is an enlarged cross-sectional view showing region B of FIG. 3.

Referring to FIGS. 1 and 3, the semiconductor chip 14 includes a substrate 35, electrode pads 36, an insulator film 37, first bump electrodes 41, and second bump electrodes 42.

The substrate 35 includes a substrate body 45 and a circuit device layer 46. The substrate body 45 has a rectangular shape. For example, a semiconductor substrate may be used for the substrate body 45. The circuit device layer 46 is formed on a first surface 45a of the substrate body 45. The circuit device layer 46 includes therein transistors (not shown) and some circuits (e.g., storage circuits and the like) and has a multilayer wiring structure.

The electrode pads 36 are provided for inputting to and outputting from some circuits (e.g., storage circuits and the like) a power source, a ground, signals, or the like. Those electrode pads 36 are provided on a surface 46a of the circuit device layer 46 (a first surface 35a of the substrate 35).

Referring to FIG. 2, the electrode pads 36 are arranged in two rows at a central area of the surface 46a of the circuit device layer 46 and also arranged at a peripheral area of the circuit device layer 46 along the electrode pads arranged at the central area. The electrode pads 36 are electrically connected to transistors (not shown) provided within the circuit device layer 46.

The insulator film 37 is provided on the surface 46a of the circuit device layer 46 so as to expose the electrode pads 36. The insulator film 37 is a film (a passivation film) for protecting the circuit device layer 46. The insulator film 37 is formed so as to have a thickness greater than the thickness of the electrode pads 36.

Referring to FIG. 4, the first bump electrodes 41 are function bumps. Each of the first bump electrodes 41 includes a first bump electrode body 48 and a first solder layer 49 which is provided at a tip side thereof. The first bump electrode body 48 includes an under-barrier metal (UBM) film 55 formed on an upper surface 36a of the electrode pad 36 and a Cu pillar 56 stacked on the UBM film 55. The first bump electrode body 48 is in the form of a circular cylinder.

The first bump electrode body 48 has a first solder formation surface 48a, or an upper surface 56a of the Cu pillar 56. The first solder formation surface 48a is a flat circular surface. The first solder layer 49 is formed on the first solder formation surface 48a. The first bump electrodes 41 are electrically connected to the circuit device layer 46 via the electrode pads 36.

The first solder layer 49 is provided on the first solder formation surface 48a, which faces the mount surface 22a of the corresponding first connection pad 22 provided on the wiring substrate 11.

The first solder layer 49 has an arc-shaped convex cross-section. This is because a central portion of the first solder layer 49 has risen due to the surface tension of solder that has melted by reflow soldering at a certain temperature.

As shown in FIG. 1, when the semiconductor chip 14 is provided on the wiring substrate 11 by flip chip bonding, the first solder layer 49 of each of the first bump electrodes 41 is connected to the mount surface 22a of the corresponding first connection pad 22 of the wiring substrate 11. Thus, the semiconductor chip 14 is electrically connected to the wiring substrate 11.

Referring to FIG. 2, the second bump electrodes 42 are support bumps (dummy bumps). Some of the second bump electrodes 42 are provided on a surface 37a of the insulator film 37 outside of the array of the pads for the first bump electrodes 41 arranged at the central area of the circuit device layer 46.

Other second bump electrodes 42 are provided on the surface 37a of the insulator film 37 near the first bump electrodes 41 arranged at the peripheral area of the circuit device layer 46.

The second bump electrodes 42 can suppress inclination of the semiconductor chip 14 with respect to the first surface 21a of the substrate body 21 and can improve the reliability of electric connection between the first bump electrodes 41 and the first connection pads 22 of the wiring substrate 11. The second bump electrodes 42 are isolated from the circuit device layer 46 by the insulator film 37. The second bump electrodes 42 are not electrically connected to the circuit device layer 46.

Since the second bump electrodes 42 are formed on the surface 37a of the insulator film 37, it is not necessary to provide electrode pads (electrode pads for support bumps) to be connected to the second bump electrodes 42 on the semiconductor chip 14. Therefore, the chip size of the semiconductor chip can be prevented from increasing.

Referring to FIG. 4, each of the second bump electrodes 42 includes a second bump electrode body 51 and a second solder layer 52 which is provided at a tip side thereof.

The second bump electrode body 51 is in the form of a circular cylinder and includes a UBM film 58 and a Cu pillar 59 stacked on the UBM film 58. The UBM film 58 is provided on the surface 37a of the insulator film 37 at a portion facing the mount surface 23a of the corresponding second connection pad 23 provided on the wiring substrate 11.

The second bump electrode body 51 has a second solder formation surface 51a, or an upper surface 59a of the Cu pillar 59. The second solder formation surface 51a is a flat circular surface. The second solder layer 52 is formed on the second solder formation surface 51a.

Furthermore, a diameter $R_2$ of the second bump electrode body 51 (a diameter of each of the second bump electrodes 42) is configured to be smaller than a diameter $R_1$ of the first bump electrode body 48 (a diameter of each of the first bump electrodes 41).

The diameters $R_1$ and $R_2$ of the first and second bump electrode bodies 48 and 51 are determined based upon the thickness of the insulator film 37.

For example, if the thickness $M_3$ of a portion of the insulator film 37 that is formed above the upper surface 36a of the electrode pad 36 is 5 μm, the diameter $R_1$ of the first bump electrode body 48 may be set at 51 μm, and the diameter $R_2$ of the second bump electrode body 51 may be set at 45 μm.

In this manner, when the diameter $R_2$ of the second bump electrode body 51 is set to be smaller than the diameter $R_1$ of the first bump electrode body 48, an area of the second solder formation surface 51a can be made smaller than an area of the first solder formation surface 48a.

Meanwhile, when the semiconductor chip 14 is to be manufactured, the first and second bump electrodes 41 and 42 are simultaneously (or collectively) formed.

Therefore, the thickness of the UBM film 55 of each of the first bump electrodes 41 and the thickness of the UBM film 58 of each of the second bump electrodes 42 become equal to each other. Furthermore, the thickness (or height) of the Cu pillar 56 of each of the first bump electrodes 41 and the thickness (or height) of the Cu pillar 59 of each of the second bump electrodes 42 become equal to each other.

In other words, the height of the first bump electrode body 48 of each of the first bump electrodes 41 and the height of the second bump electrode body 51 of each of the second bump electrodes 42 become equal to each other.

The second solder layer 52 is provided on the second solder formation surface 51a, which faces the mount surface 23a of the corresponding second connection pad 23 provided on the wiring substrate 11.

The second solder layer 52 has an arc-shaped convex cross-section. This is because a central portion of the second solder layer 52 has risen due to the surface tension of solder that has melted by reflow soldering at a certain temperature.

As shown in FIG. 1, when the semiconductor chip 14 is provided on the wiring substrate 11 by flip chip bonding, the second solder layer 52 of each of the second bump electrodes 42 is connected to the mount surface 23a of the corresponding second connection pad 23 of the wiring substrate 11.

Meanwhile, as described above, an area of the second solder formation surface 51a is smaller than an area of the first solder formation surface 48a.

Therefore, the amount of solder formed on the second solder formation surface 51a is less than the amount of solder formed on the first solder formation surface 48a.

Accordingly, the thickness $M_2$ of the arc-shaped second solder layer 52 (the thickness of the second solder layer 52 measured at the top 52A of the second solder layer 52) is less than the thickness $M_1$ of the arc-shaped first solder layer 49 (the thickness of the first solder layer 49 measured at the top 49A of the first solder layer 49).

Thus, the height $H_2$ of each of the second bump electrodes 42 can be made lower than the height $H_1$ of each of the first bump electrodes 41.

As a result, the top 52A of the second solder layer 52 of the second bump electrode 42, which is formed on the surface 37a of the insulator film 37 located at a position above the upper surface 36a of the electrode pad 36, can be arranged at substantially the same height as the top 49A of the first solder layer 49 of the first bump electrode 41, which is formed on the upper surface 36a of the electrode pad 36.

Accordingly, it is possible to reduce positional variations in height of the tops 41A and 42A of the first and second bump electrodes 41 and 42 (the tops 49A and 52A of the first and second solder layers 49 and 52) that would be caused by the thickness $M_3$ of a portion of the insulator film 37 that is formed above the upper surface 36a of the electrode pad 36. Furthermore, the tops 41A and 42A of the first and second bump electrodes 41 and 42 can be positioned at substantially the same height.

Moreover, since positional variations in height of the tops 41A and 42A of the first and second bump electrodes 41 and 42 are thus reduced, a constricted portion, a void, or the like is prevented from being generated at the first solder layers 49 of the first bump electrodes 41. Therefore, the reliability of electric connection between the first bump electrodes 41 and the first connection pads 22 of the wiring substrate 11 (the reliability of flip-chip connection) can be improved when the first bump electrodes 41 and the first connection pads 22 of the wiring substrate 11 are jointed by flip-chip connection.

Furthermore, as the diameter $R_2$ of each of the second bump electrode bodies 51 is made smaller, a parasitic capacitance with a chip signal circuit formed in the circuit device layer 46 can further be reduced.

Such reduction of a parasitic capacitance results from reduction of a cross section of the second bump electrode bodies 51 located near the surface 46a of the circuit device layer 46 (a cross section of the second bump electrode body 51 cut on a plane parallel to the surface 46a of the circuit device layer 46).

Furthermore, no flattening process for the insulator film 37 is required unlike the method disclosed in JP-A 2000-243785 (Patent Literature 2), which includes flattening a surface protective film and then forming function bumps and dummy bumps such that the height of the function bumps and the dummy bumps are equalized. Therefore, the cost for the semiconductor chip 14 is prevented from increasing.

Referring to FIG. 1, the first sealing resin 15 is provided so that a gap between the wiring substrate 11 and the semiconductor chip 14 is filled with the first sealing resin 15. The first sealing resin 15 has a function of protecting joint portions between the first bump electrodes 41 and the first connection pads 22 and joint portions between the second bump electrodes 42 and the second connection pads 23.

The first sealing resin 15 also has a function of preventing voids from being generated between the wiring substrate 11 and the semiconductor chip 14 by entering of the second sealing resin 16 into the gap between the wiring substrate 11 and the semiconductor chip 14.

For example, an underfilling resin may be used for the first sealing resin 15.

The second sealing resin 16 is provided on a surface of the wiring substrate 11 so that the semiconductor chip 14 and the first sealing resin 15 are covered with the second sealing resin 16. Thus, the second sealing resin 16 seals the semiconductor chip 14. The second sealing resin 16 has an upper surface 16a that has been flattened. For example, a molding resin may be used for the second sealing resin 16.

According to the semiconductor chip and the semiconductor device of the first embodiment, the electrode pads 36 are provided on the first surface 35a of the substrate 35. The insulator film 37 is provided on the first surface 35a of the substrate 35 so that part of the electrode pads 36 is exposed. The first bump electrodes 41 are provided on the upper surfaces 36a of the electrode pads 36. Each of the first bump electrodes 41 has a structure in which the first bump electrode body 48 and the first solder layer 49 are sequentially stacked. The second bump electrodes 42 are arranged on the surface 37a of the insulator film 37. Each of the second bump electrodes 42 has a structure in which the second bump electrode body 51 and the second solder layer 52 are sequentially stacked. The second bump electrode body 51 has a diameter $R_2$ smaller than a diameter $R_1$ of the first bump electrode body 48. Therefore, an area of the second solder formation surface 51a of the second bump electrode body 51 of each of the second bump electrodes 42 becomes smaller than an area of the first solder formation surface 48a of the first bump electrode body 48 of each of the first bump electrodes 41.

Accordingly, the amount of solder formed on the second solder formation surface 51a becomes less than the amount of solder formed on the first solder formation surface 48a. As a result, the thickness $M_2$ of the arc-shaped second solder layer 52 (the thickness of the second solder layer 52 measured at the top 52A of the second solder layer 52) is less than the thickness $M_1$ of the arc-shaped first solder layer 49 (the thickness of the first solder layer 49 measured at the top 49A of the first solder layer 49).

Thus, the height $H_2$ of each of the second bump electrodes 42 can be made lower than the height $H_1$ of each of the first bump electrodes 41.

As a result, the top 52A of the second solder layer 52 of the second bump electrode 42, which is formed on the surface 37a of the insulator film 37 located at a position above the upper surface 36a of the electrode pad 36, can be arranged at substantially the same height as the top 49A of the first solder layer 49 of the first bump electrode 41, which is formed on the upper surface 36a of the electrode pad 36.

Accordingly, it is possible to reduce positional variations in height of the tops 41A and 42A of the first and second bump electrodes 41 and 42 (the tops 49A and 52A of the first and second solder layers 49 and 52) that would be caused by the thickness $M_3$ of a portion of the insulator film 37 that is formed above the upper surface 36a of the electrode pad 36. Furthermore, the tops 41A and 42A of the first and second bump electrodes 41 and 42 can be positioned at substantially the same height.

Moreover, since positional variations in height of the tops 41A and 42A of the first and second bump electrodes 41 and 42 are thus reduced, a constricted portion, a void, or the like is prevented from being generated at the first solder layers 49 of the first bump electrodes 41. Therefore, the reliability of electric connection between the first bump electrodes 41 and the first connection pads 22 of the wiring substrate 11 (the reliability of flip-chip connection) can be improved when the first bump electrodes 41 and the first connection pads 22 of the wiring substrate 11 are jointed by flip-chip connection.

Furthermore, as the diameter $R_2$ of each of the second bump electrode bodies 51 is made smaller, a parasitic capacitance with a chip signal circuit formed in the circuit device layer 46 can further be reduced.

Furthermore, no flattening process for the insulator film 37 is required unlike the method disclosed in JP-A 2000-243785 (Patent Literature 2), which includes flattening a surface protective film and then forming function bumps and dummy bumps such that the height of the function bumps and the dummy bumps are equalized. Therefore, the cost for the semiconductor chip 14 is prevented from increasing.

FIGS. 5 to 17 are cross-sectional views showing a manufacturing process of a semiconductor device according to the first embodiment of the present invention. Cross sections of the structure illustrated in FIGS. 5 to 12 correspond to the cross section of the semiconductor chip 14 illustrated in FIG. 4. In FIGS. 5 to 12, the same components as in the semiconductor chip 14 illustrated in FIG. 4 are denoted by the same reference numerals.

Furthermore, cross sections of the structure illustrated in FIGS. 13 to 17 correspond to the cross section of the semiconductor device 10 illustrated in FIG. 1. In FIGS. 13 to 17, the same components as in the semiconductor device 10 illustrated in FIG. 1 are denoted by the same reference numerals.

FIGS. 5 to 12 illustrate only part of a cross section of the semiconductor chip 14. In practice, circuits corresponding to a plurality of semiconductor chips 14 and the like are formed on a wafer (substrate body 45), which has a plurality of chip formation areas and dicing lines for dividing the wafer into those chip formation areas. Then the wafer is cut along the dicing lines to dice the wafer into a plurality of semiconductor chips 14. Thus, semiconductor chips 14 are produced.

A method of manufacturing a semiconductor device 10 according to the first embodiment of the present invention will be described below with reference to FIGS. 5 to 17. In the explanation of the manufacturing method of a semiconductor device 10, a method of manufacturing a semiconductor chip 14 according to the first embodiment of the present invention will also be described with reference to FIGS. 5 to 12.

Figure 5:
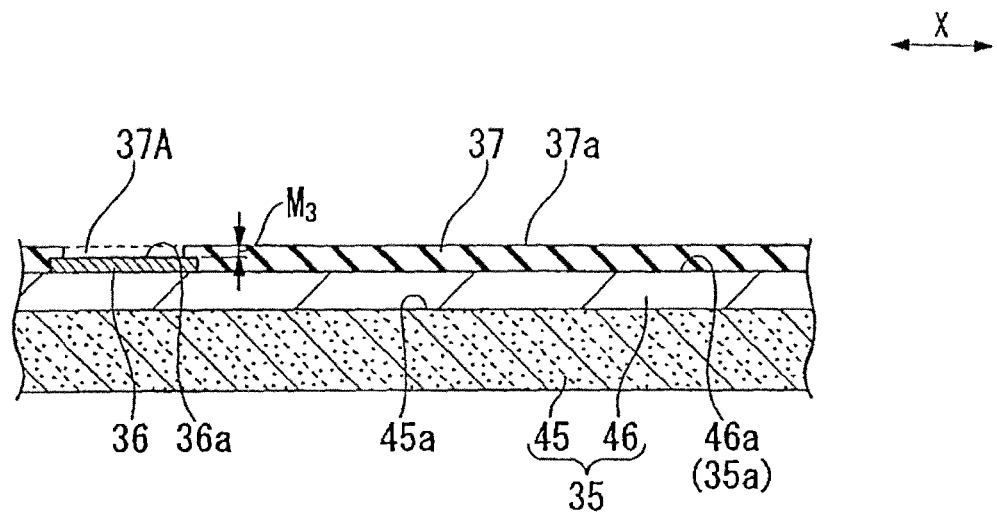
FIG. 5 is a cross-sectional view showing a (first) manufacturing process of a semiconductor device according to the first embodiment of the present invention, which corresponds to the cross-section of the semiconductor chip illustrated in FIG. 4.

First, in a step illustrated in FIG. 5, a semiconductor substrate (e.g., a monocrystalline silicon substrate) is prepared as a substrate body 45. Then a circuit device layer 46 is formed on a first surface 45a of a substrate body 45 by using known technique. Thus, a substrate 35 with the substrate body 45 and the circuit device layer 46 is formed.

At that time, the circuit device layer 46 is formed so as to have a multilayer wiring structure with transistors (not shown) and some circuits (e.g., storage circuits and the like).

Subsequently, electrode pads 36 are formed on an upper surface 46a of the circuit device layer 46 (a first surface 35a of the substrate 35) by using known technique. The electrode pads 36 are electrically connected to the transistors (not shown) and some circuits in the circuit device layer 46. For example, Al can be used as a material for the electrode pads 36.

Thereafter, an insulator film 37 (protective film) is formed on the upper surface 46a of the circuit device layer 46 by using known technique so as to have openings 37A that expose part of an upper surface 36a of each of the electrode pads 36 (part at which first bump electrodes 41 are to be formed).

Thus, the insulator film 37 is formed on part of the upper surfaces 36a of the electrode pads 36. For example, the thickness $M_3$ of those portions of the insulator film 37 may be set at 5 µm.

Figure 6:
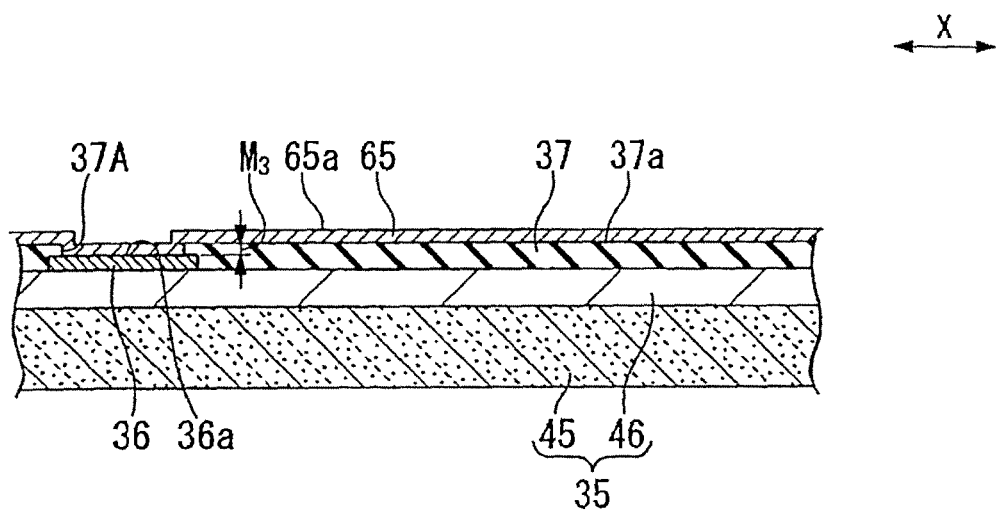
FIG. 6 is a cross-sectional view showing a (second) manufacturing process of the semiconductor device according to the first embodiment of the present invention, which corresponds to the cross-section of the semiconductor chip illustrated in FIG. 4.

Then, in a step illustrated in FIG. 6, an UBM film 65 is formed so that a surface 37a of the insulator film 37 and inner surfaces of the openings 37A (including exposed portions of the upper surfaces 36a of the electrode pads 36 in the openings 37A) are covered with the UBM film 65.

Specifically, a Ti film and a Cu film are sequentially deposited by a sputtering method so as to form a UBM film 65 having a Ti/Cu multilayer film.

Figure 11:
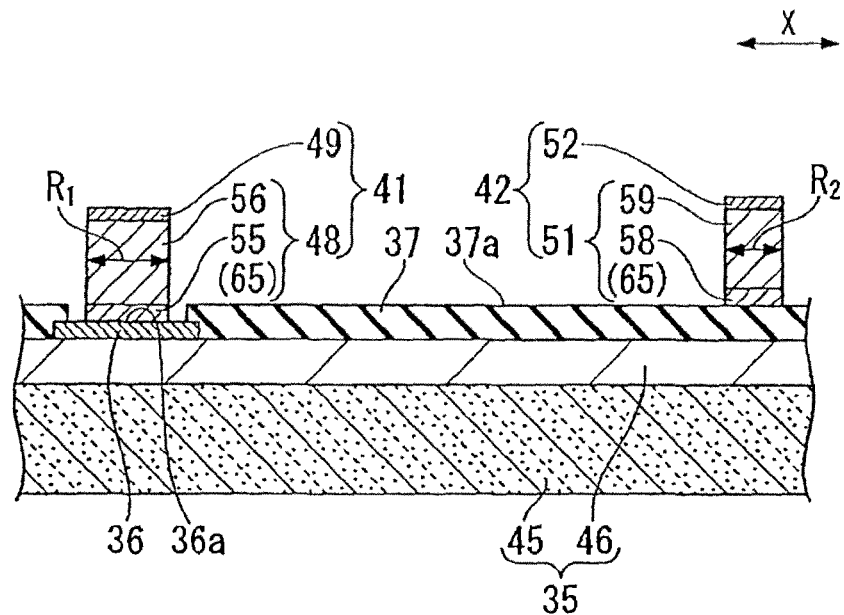
FIG. 11 is a cross-sectional view showing a (seventh) manufacturing process of the semiconductor device according to the first embodiment of the present invention, which corresponds to the cross-section of the semiconductor chip illustrated in FIG. 4.

When the UBM film 65 is patterned in a subsequent step illustrated in FIG. 11, it becomes UBM films 55 and 58 illustrated in FIG. 4. That is, the UBM film 65 is a base material film for the UBM films 55 and 58.

Subsequently, in a step illustrated in FIG. 7, a resist film 67 is applied onto a surface 65a of the UBM film 65 so that the surface 65a of the UBM film 65 is covered with the resist film 67. For example, the resist film 67 may have a thickness of 20 µm.

Figure 7:
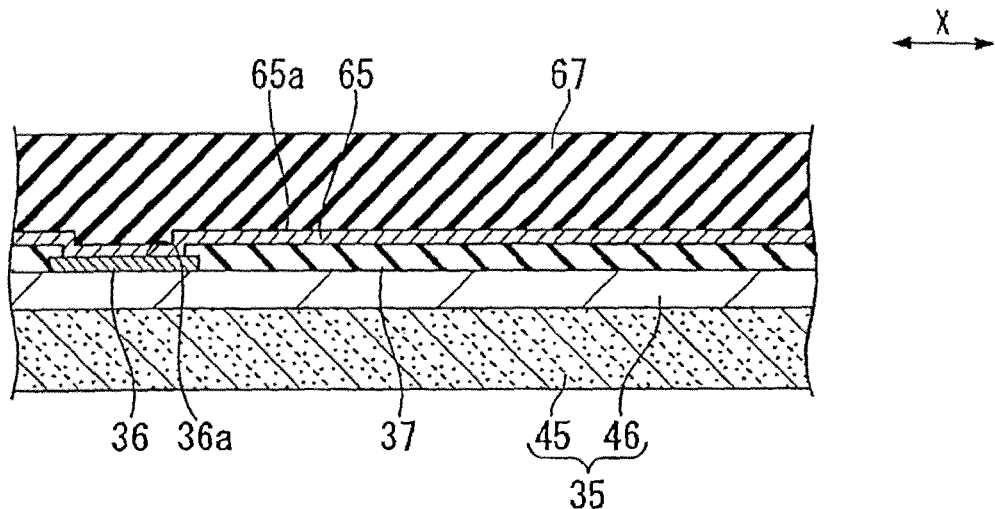
FIG. 7 is a cross-sectional view showing a (third) manufacturing process of the semiconductor device according to the first embodiment of the present invention, which corresponds to the cross-section of the semiconductor chip illustrated in FIG. 4.
Figure 8:
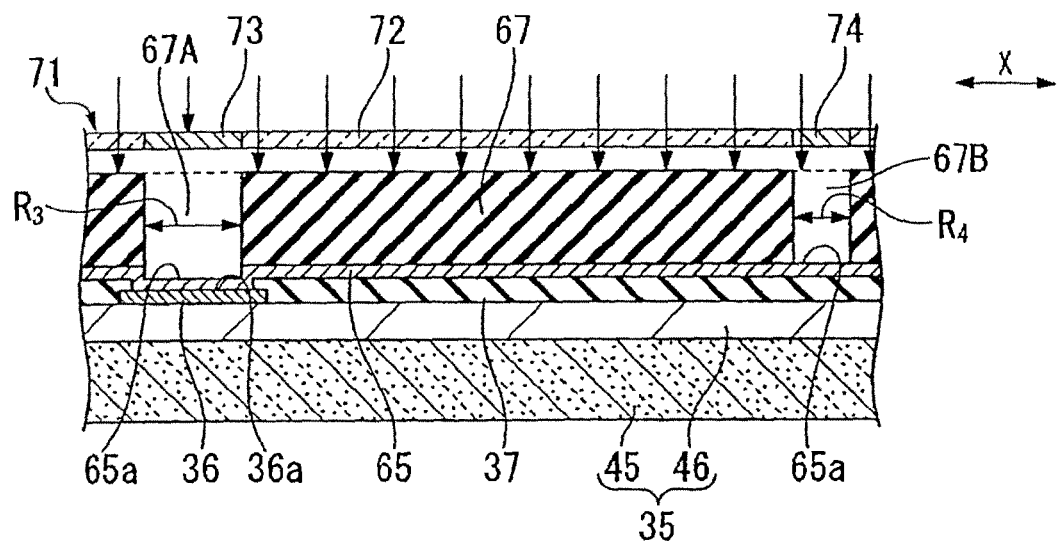
FIG. 8 is a cross-sectional view showing a (fourth) manufacturing process of the semiconductor device according to the first embodiment of the present invention, which corresponds to the cross-section of the semiconductor chip illustrated in FIG. 4.

Thereafter, in a step illustrated in FIG. 8, the resist film 67 provided on the structure illustrated in FIG. 7 is subjected to an exposure process with an exposure mask 71 (reticle), which includes first light-shielding portions 73 corresponding to areas at which the first bump electrodes 41 are to be formed (see FIG. 11), second light-shielding portions 74 corresponding to areas at which the second bump electrodes 42 are to be formed (see FIG. 11), and a light transmission portion 72 that allows light from an exposure apparatus (not shown) to pass therethrough.

FIG. 8 illustrates an example in which a negative type resist film is used as the resist film 67. Part of a negative type resist film to which light has been applied remains after a development process.

In the step illustrated in FIG. 7, a positive type resist film may be used as the resist film 67. In this case, part of the resist film 67 to which light has been applied is removed by a development process during the step illustrated in FIG. 8. Therefore, another exposure mask different from the exposure mask 71 illustrated in FIG. 8 should be prepared.

FIG. 8 illustrates an example in which the shape of the first light-shielding portion 73 is the same as the shape of the first bump electrode 41 as viewed in a plan view, whereas the shape of the second light-shielding portion 74 is the same as the shape of the second bump electrode 42 as viewed in a plan view. In practice, an exposure process is performed by using a reduction exposure method.

Therefore, the actual shape of the first light-shielding portion 73 formed in the exposure mask 71 is larger than the shape of the first bump electrode 41 as viewed in a plan view, and the actual shape of the second light-shielding portion 74 is larger than the shape of the second bump electrode 42 as viewed in a plan view.

A development process is then performed on the resist film 67 that has been subjected to the exposure process, so that first openings 67A in the form of a circular cylinder and second openings 67B in the form of a circular cylinder are collectively formed in the resist film 67. The first openings 67A allow the surface 65a of the UBM film 65 formed on the electrode pads 36 to be exposed. The second openings 67B allow the surface 65a of the UBM film 65 formed on the insulator film 37 to be exposed.

At that time, the first and second openings 67A and 67B are formed such that the diameter $R_4$ of each of the second openings 67B is smaller than the diameter $R_3$ of each of the first openings 67A.

The diameter $R_3$ of each of the first openings 67A is the same as the diameter $R_1$ of each of the first bump electrode bodies 48 illustrated in FIG. 4. The diameter $R_4$ of each of the second openings 67B is the same as the diameter $R_2$ of each of the second bump electrode bodies 51 illustrated in FIG. 4.

FIG. 8 shows that the first and second openings 67A and 67B are formed after an exposure process. Practically, an exposure process using the exposure mask 71 is performed, and then the exposed resist film 67 is developed so that the first and second openings 67A and 67B are formed as illustrated in FIG. 8.

In the step illustrated in FIG. 8, first and second openings 67A and 67B having different diameters can readily be formed by changing the exposure mask 71.

Subsequently, in a step illustrated in FIG. 9, a Cu plating film 77 and a plating solder 78 are sequentially formed on the surface 65a of the UBM film 65 exposed in the first openings 67A and the surface 65a of the UBM film 65 exposed in the second openings 67B by an electrolytic plating method using the UBM film 65 as a feeding layer.

Thus, a Cu pillar 56 of the Cu plating film 77, which is formed on the surface 65a of the UBM film 65 exposed in the first openings 67A, and a Cu pillar 59 of the Cu plating film 77, which is formed on the surface 65a of the UBM film 65 exposed in the second openings 67B, are formed simultaneously. Specifically, a Cu pillar 59 having a diameter $R_2$ that is smaller than the diameter $R_1$ of the Cu pillar 56 and a height $H_4$ that is the same as the height $H_3$ of the Cu pillar 56 can be formed concurrently with the formation of the Cu pillar 56.

Figure 9:
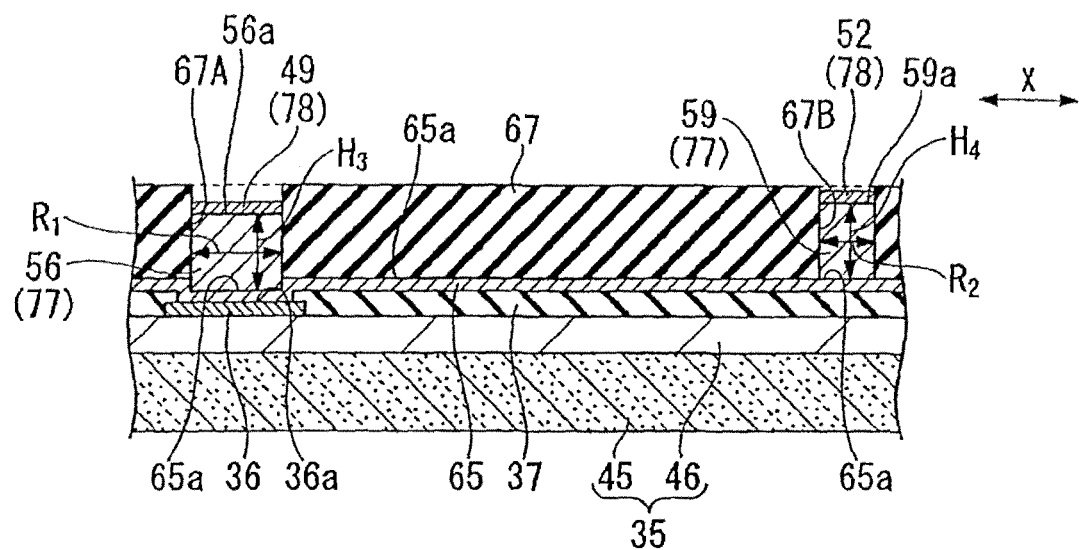
FIG. 9 is a cross-sectional view showing a (fifth) manufacturing process of the semiconductor device according to the first embodiment of the present invention, which corresponds to the cross-section of the semiconductor chip illustrated in FIG. 4.

Furthermore, in the step illustrated in FIG. 9, a first solder layer 49 of the plating solder 78 that is located on an upper surface 56a of the Cu pillar 56 and a second solder layer 52 of the plating solder 78 that is located on an upper surface 59a of the Cu pillar 59 are formed simultaneously. The thickness of the first solder layer 49 is the same as the thickness of the second solder layer 52.

As described above, the diameter $R_1$ of the Cu pillar 56 is greater than the diameter $R_2$ of the Cu pillar 59, and the thickness of the first solder layer 49 is the same as the thickness of the second solder layer 52. Therefore, the amount of solder formed on the upper surface 56a of the Cu pillar 56 and on the upper surface 59a of the Cu pillar 59 depends upon the diameter of the Cu pillar 56 and the Cu pillar 59. In other words, the amount of solder formed on the upper surface 56a of the Cu pillar 56 is larger than the amount of solder formed on the upper surface 59a of the Cu pillar 59.

At this stage, each of the first and second solder layers 49 and 52 is in the form of a layer having a certain thickness. The upper surface of the second solder layer 49 is located at a position higher than the position of an upper surface of the first solder layer 52.

Figure 10:
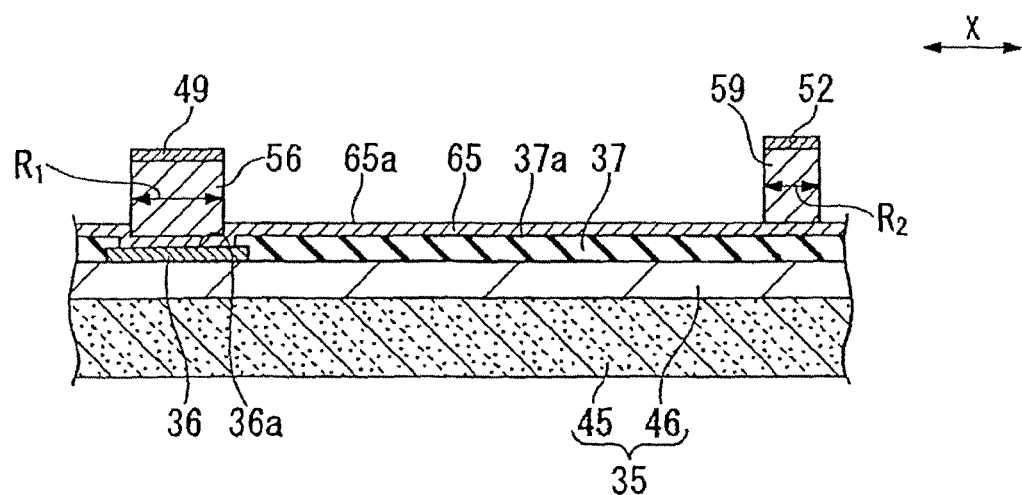
FIG. 10 is a cross-sectional view showing a (sixth) manufacturing process of the semiconductor device according to the first embodiment of the present invention, which corresponds to the cross-section of the semiconductor chip illustrated in FIG. 4.

Then, in a step illustrated in FIG. 10, the resist film 67 illustrated in FIG. 9 is removed, so that the surface 65a of the UBM film 65 is exposed.

Subsequently, in a step illustrated in FIG. 11, the UBM film 65 shown in FIG. 10 is subjected to an etching-back process so that the UBM film 65 is left only underneath the Cu pillars 56 and 59. Thus, UBM films 55 and 58 are formed as shown in FIG. 11.

In this manner, there are formed first bump electrodes 41 in which the UBM film 55, the Cu pillar 56, and the solder layer 49 are stacked sequentially on the upper surface 36a of each of the electrode pads 36. Simultaneously, there are formed second bump electrodes 42 in which the UBM film 58, the Cu pillar 59, and the solder layer 52 are stacked sequentially on the upper surface 37a of the insulator film 37.

At this stage, each of the first and second solder layers 49 and 52 is also in the form of a layer having a certain thickness. The upper surface of the second solder layer 49 is located at a position higher than the position of an upper surface of the first solder layer 52.

Figure 12:
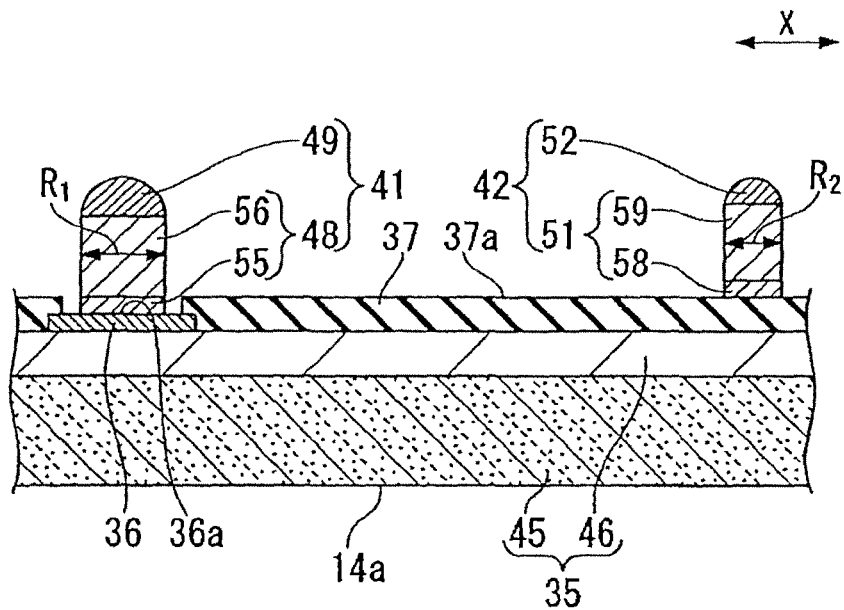
FIG. 12 is a cross-sectional view showing a (eighth) manufacturing process of the semiconductor device according to the first embodiment of the present invention, which corresponds to the cross-section of the semiconductor chip illustrated in FIG. 4.

Then, in a step illustrated in FIG. 12, the semiconductor chip is heated at a certain temperature (e.g., 240° C.) so that the first and second solder layers 49 and 52 are melted (for reflow soldering). Thus, a semiconductor chip 14 according to the first embodiment is produced.

In this manner, when the first and second solder layers 49 and 52 are melted, the surface tension of solder causes the first and second solder layers 49 and 52 to have an arc-shaped convex shape.

As described above, the amount of solder formed on the upper surface 56a of the Cu pillar 56 is larger than the amount of solder formed on the upper surface 59a of the Cu pillar 59. Therefore, in the step illustrated in FIG. 12, the vertical position of the top 52A of the second solder layer 52 becomes substantially equal to the vertical position of the top 49A of the first solder layer 49.

Accordingly, it is possible to reduce positional variations in height of the tops 41A and 42A of the first and second bump electrodes 41 and 42 (the tops 49A and 52A of the first and second solder layers 49 and 52) that would be caused by the thickness $M_3$ of a portion of the insulator film 37 that is formed above the upper surface 36a of the electrode pad 36. Furthermore, the tops 41A and 42A of the first and second bump electrodes 41 and 42 can be positioned at substantially the same height.

Furthermore, as the diameter $R_2$ of each of the second bump electrode bodies 51 is made smaller, a parasitic capacitance with a chip signal circuit formed in the circuit device layer 46 can further be reduced.

In addition, no flattening process for the insulator film 37 is required unlike the method disclosed in JP-A 2000-243785 (Patent Literature 2), which includes flattening a surface protective film and then forming function bumps and dummy bumps such that the height of the function bumps and the dummy bumps are equalized. No additional process is also required. Therefore, the cost for the semiconductor chip 14 is prevented from increasing.

Figure 13:
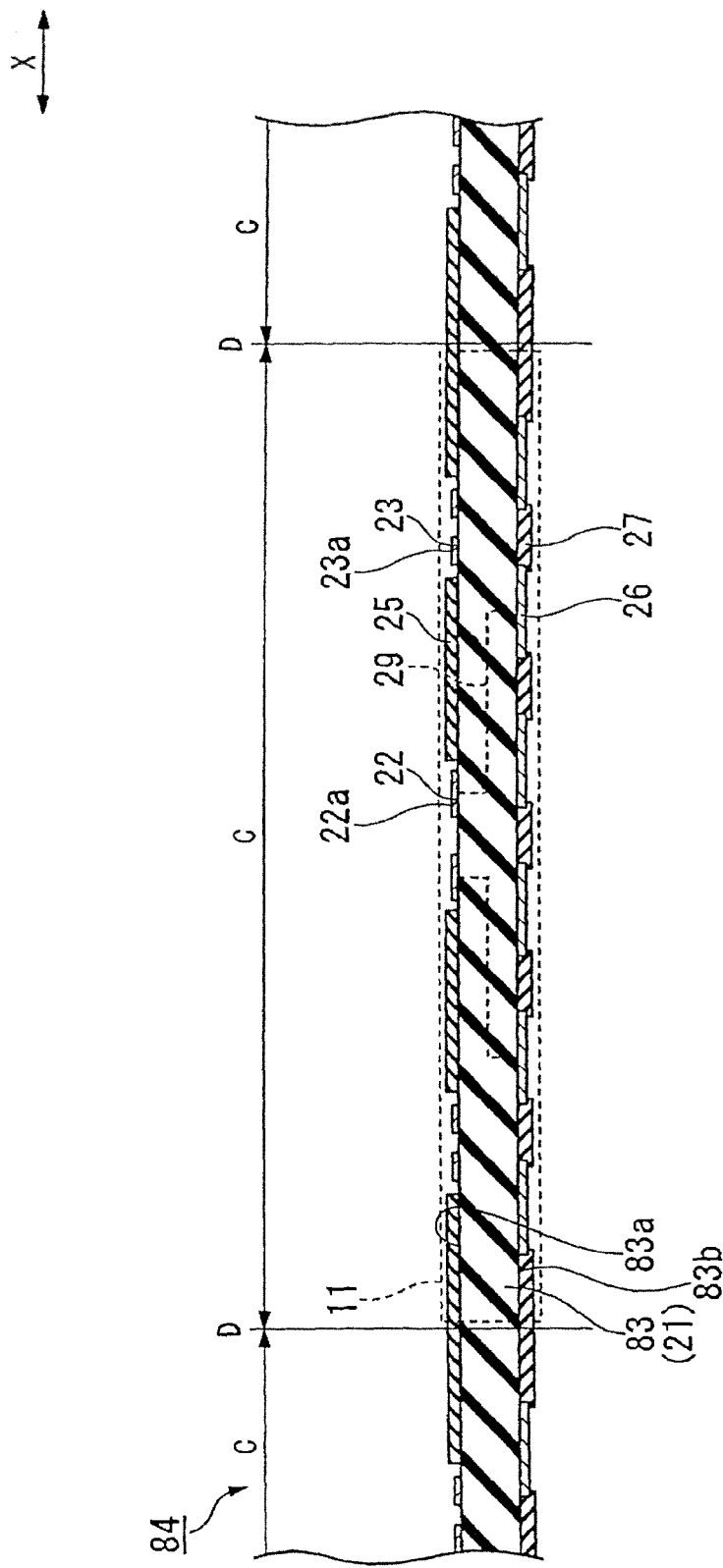
FIG. 13 is a cross-sectional view showing a (ninth) manufacturing process of the semiconductor device according to the first embodiment of the present invention, which corresponds to the cross-section of the semiconductor chip illustrated in FIG. 4.

Subsequently, in a step illustrated in FIG. 13, there is prepared a substrate body 83 having a plurality of wiring substrate formation areas C divided by dicing lines D. The substrate body 83 becomes a substrate body 21 previously described in connection with FIG. 1 when it is diced in a subsequent step illustrated in FIG. 16. In other words, the substrate body 83 is a base material for the substrate body 21.

Then first connection pads 22, second connection pads 23, and a first solder resist 25 are formed on a first surface 83a of the substrate body 83 in each of the wiring substrate formation areas C by using known technique. Furthermore, external connection pads 26 and a second solder resist 27 are formed on a second surface 83b of the substrate body 83. Wiring patterns 29 electrically connected to the first connection pads 22 and the external connection pads 26 are formed within the substrate body 83.

Thus, a base wiring substrate 84 is produced with wiring substrates 11 respectively formed in the wiring substrate formation areas C. At this stage, the base wiring substrate 84 is not diced into a plurality of wiring substrates 11, and those wiring substrates 11 are connected to each other.

Figure 14:
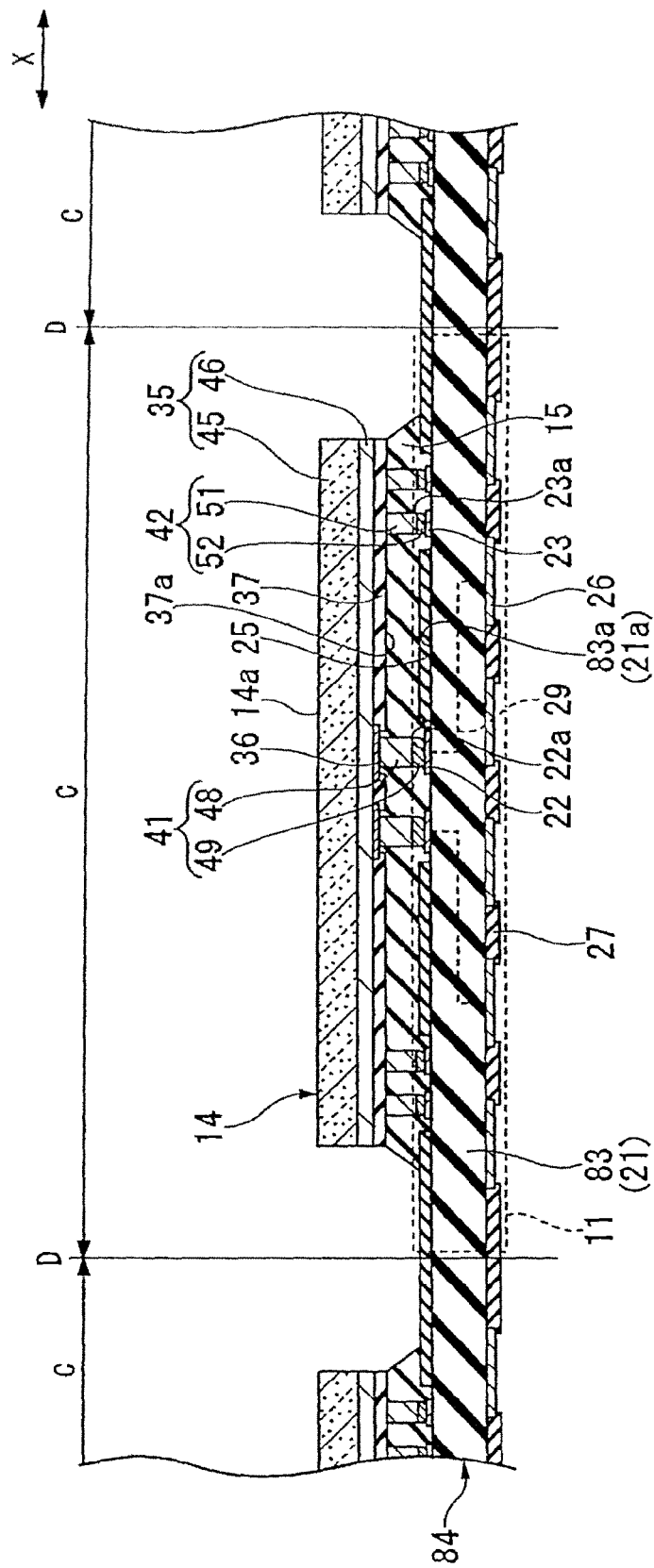
FIG. 14 is a cross-sectional view showing a (tenth) manufacturing process of the semiconductor device according to the first embodiment of the present invention, which corresponds to the cross-section of the semiconductor chip illustrated in FIG. 4.

Next, in a step illustrated in FIG. 14, the semiconductor chip 14 illustrated in FIG. 12 is vertically inversed and mounted on each of the wiring substrates 11 by flip chip connection.

Specifically, a rear face 14a of the semiconductor chip 14 illustrated in FIG. 12 is sucked and held by a bonding tool (not shown). In a state in which the semiconductor chip 14 has been heated to a high temperature of about 240° C., loads are applied so that the semiconductor chip 14 is connected to each of the wiring substrates 11 by flip chip bonding.

Thus, each of the first bump electrode bodies 48 is connected to the mount surface 22a of the corresponding first connection pad 22 via the first solder layer 49 having an arc-shaped convex shape, and each of the second bump electrode bodies 51 is connected to the mount surface 23a of the corresponding second connection pad 23 via the second solder layer 52 having an arc-shaped convex shape.

In this manner, the first and second bump electrodes 41 and 42, which are reduced in positional variation of the tops 41A and 42A in their height direction by the first and second solder layers 49 and 52 having an arc-shaped convex shape, are connected to the first and second connection pads 22 and 23 formed on the first surface 83a of the substrate body 83. Therefore, when the semiconductor chip 14 is mounted on the wiring substrate 11 by flip chip connection, the semiconductor chip 14 can be prevented from being inclined with respect to the wiring substrate 11. Additionally, a constricted portion, a void, or the like is prevented from being generated at the first solder layers 49 of the first bump electrodes 41.

Thus, the first bump electrodes 41 and the first connection pads 22 can satisfactorily be connected to each other by flip chip connection. Therefore, the reliability of electric connection between the semiconductor chip 14 and the wiring substrate 11 can be improved.

That is, the reliability of the semiconductor device 10 and the production yield can be improved.

Next, a first sealing resin 15 is formed so that a gap between the semiconductor chip 14 and the wiring substrate 11 is filled with the first sealing resin 15. For example, an underfilling resin may be dropped onto sidewalls of the semiconductor chip 14 so that a gap between the semiconductor chip 14 and the wiring substrate 11 is filled with the underfilling resin because of a capillary phenomenon.

Then the underfilling resin is cured (subjected to heat treatment) at a certain temperature (e.g., 150° C.). Thus, a first sealing resin 15 of the hardened underfilling resin is formed with fillets.

Instead of the underfilling resin, non-conductive paste (NCP) may be used for the first sealing resin 15. In this case, NCP may be arranged in advance on an upper surface of the wiring substrate 11 so that the NCP spreads into a gap between the wiring substrate 11 and the semiconductor chip 14 through flip chip bonding to thereby form a first sealing resin 15 of NCP.

Furthermore, in the step illustrated in FIG. 14, one semiconductor chip 14 is mounted on each of the wiring substrates 11 by flip chip bonding. Then a gap between the semiconductor chip 14 and the wiring substrate 11 is sealed by a first sealing resin 15.

Figure 15:
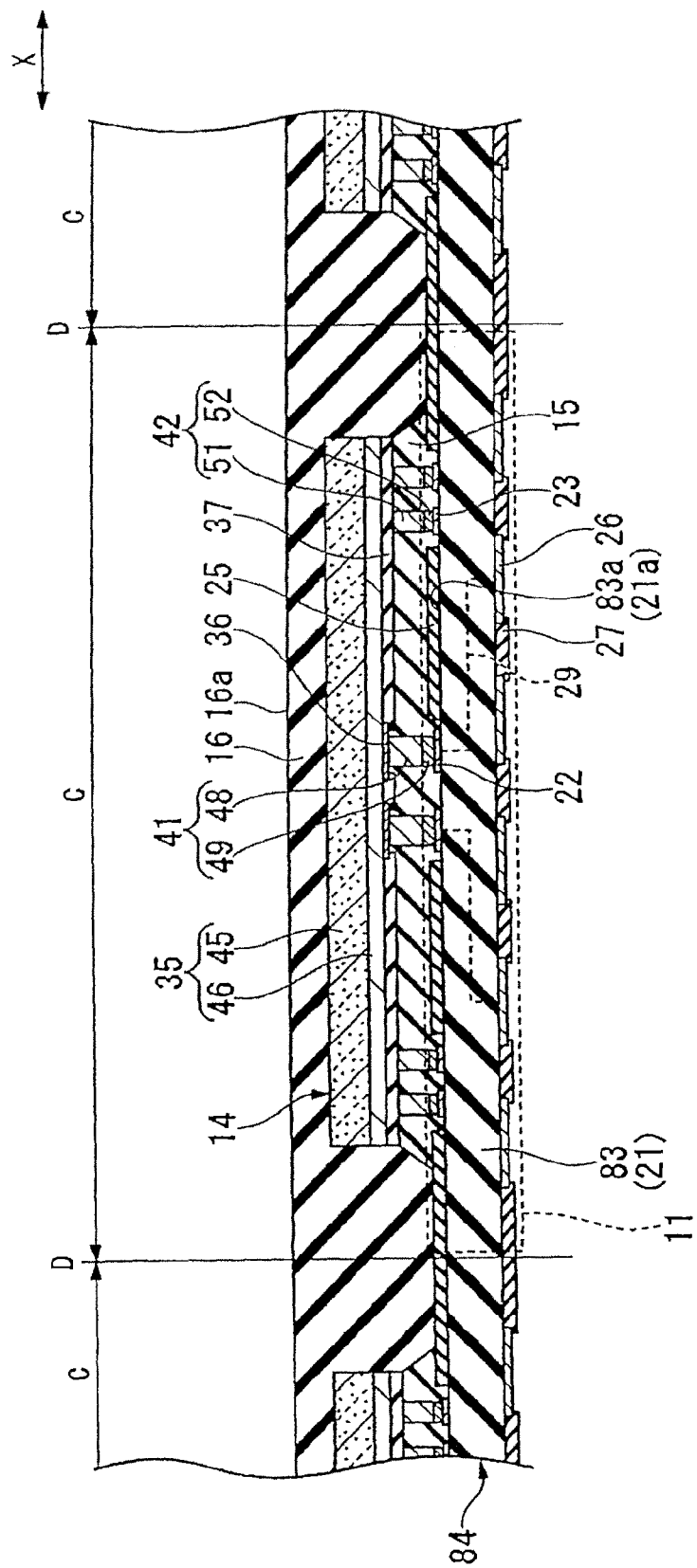
FIG. 15 is a cross-sectional view showing a (eleventh) manufacturing process of the semiconductor device according to the first embodiment of the present invention, which corresponds to the cross-section of the semiconductor chip illustrated in FIG. 4.

Subsequently, in a step illustrated in FIG. 15, a second sealing resin 16 is formed on an upper surface of the base wiring substrate 84 (a surface of the base wiring substrate 84 that is located near the first surface 83a of the substrate body 83). The second sealing resin 16 seals a plurality of semiconductor chips 14 that have been mounted on the base wiring substrate 84. The second sealing resin 16 has a flat upper surface 16a.

For example, when a molding resin is used as the second sealing resin 16, the second sealing resin 16 may be formed by a transfer molding method.

Figure 16:
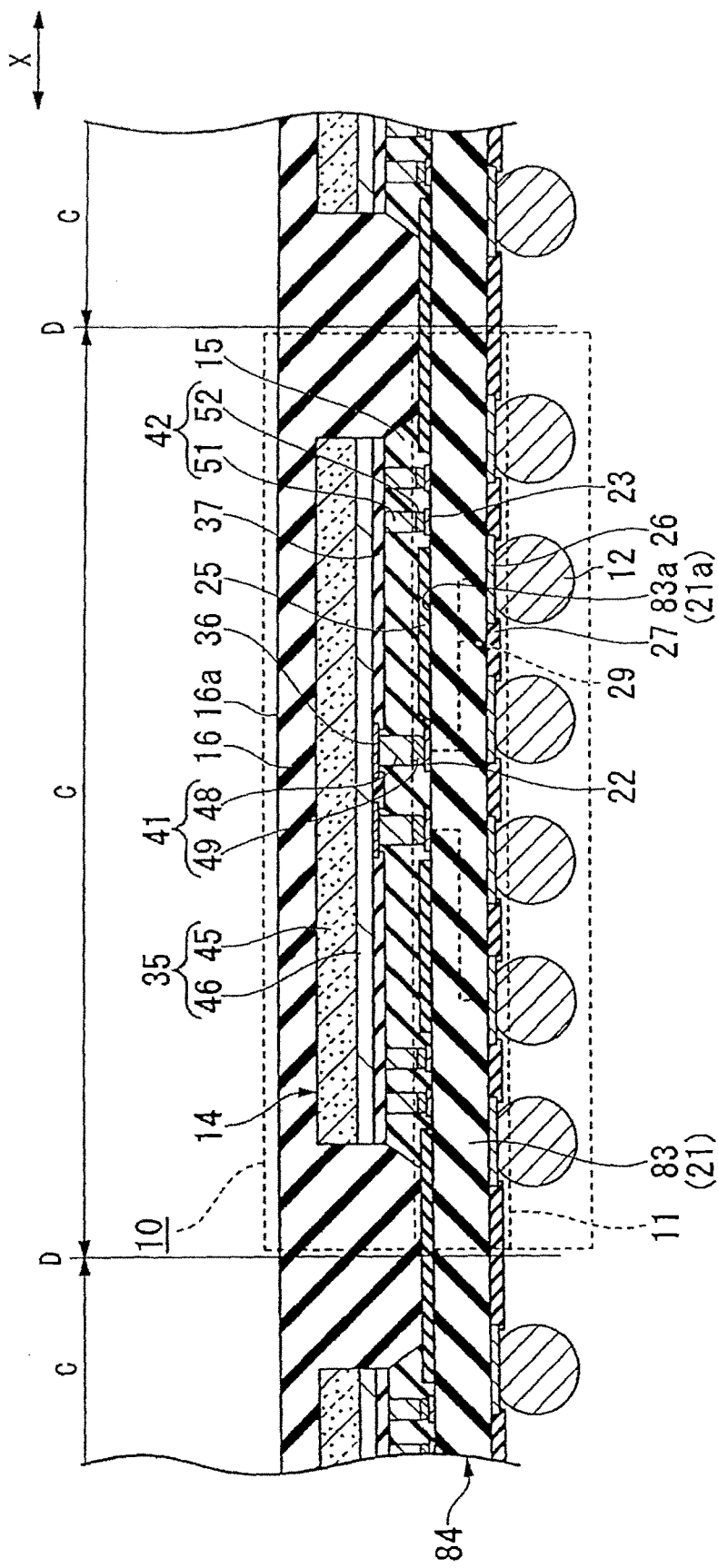
FIG. 16 is a cross-sectional view showing a (twelfth) manufacturing process of the semiconductor device according to the first embodiment of the present invention, which corresponds to the cross-section of the semiconductor chip illustrated in FIG. 4.

Next, in a step illustrated in FIG. 16, external connection terminals 12 are arranged on the external connection pads 26. Thus, a semiconductor device 10 is produced in each of the wiring substrate formation areas C.

In this manner, the external connection terminals 12 are electrically connected to the semiconductor chip 14 via the external connection pads 26. For example, solder balls may be used for the external connection terminals 12.

Figure 17:
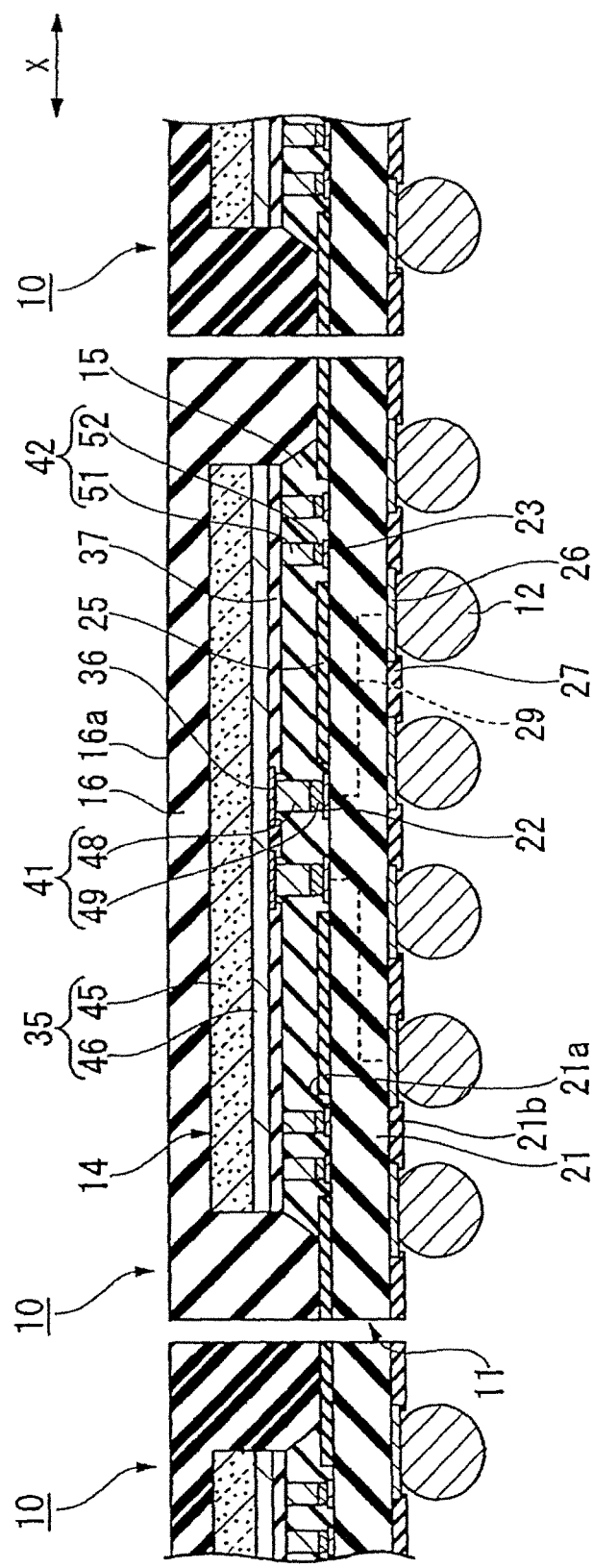
FIG. 17 is a cross-sectional view showing a (thirteenth) manufacturing process of the semiconductor device according to the first embodiment of the present invention, which corresponds to the cross-section of the semiconductor chip illustrated in FIG. 4.

Then, in a step illustrated in FIG. 17, the structure shown in FIG. 16 is cut along the dicing lines and dicing into semiconductor devices 10. Thus, a plurality of semiconductor devices 10 are produced.

According to the method for manufacturing the semiconductor device of the first embodiment, the first and second bump electrodes 41 and 42, which are reduced in positional variation of the tops 41A and 42A in their height direction by the first and second solder layers 49 and 52 having an arc-shaped convex shape, are connected to the first and second connection pads 22 and 23 formed on the first surface 83a of the substrate body 83. Therefore, when the semiconductor chip 14 is mounted on the wiring substrate 11 by flip chip connection, the semiconductor chip 14 can be prevented from being inclined with respect to the wiring substrate 11. Additionally, a constricted portion, a void, or the like is prevented from being generated at the first solder layers 49 of the first bump electrodes 41.

Thus, the first bump electrodes 41 and the first connection pads 22 can satisfactorily be connected to each other by flip chip connection. Therefore, the reliability of electric connection between the semiconductor chip 14 and the wiring substrate 11 can be improved.

That is, the reliability of the semiconductor device 10 and the production yield can be improved.

(Second Embodiment)

Figure 18:
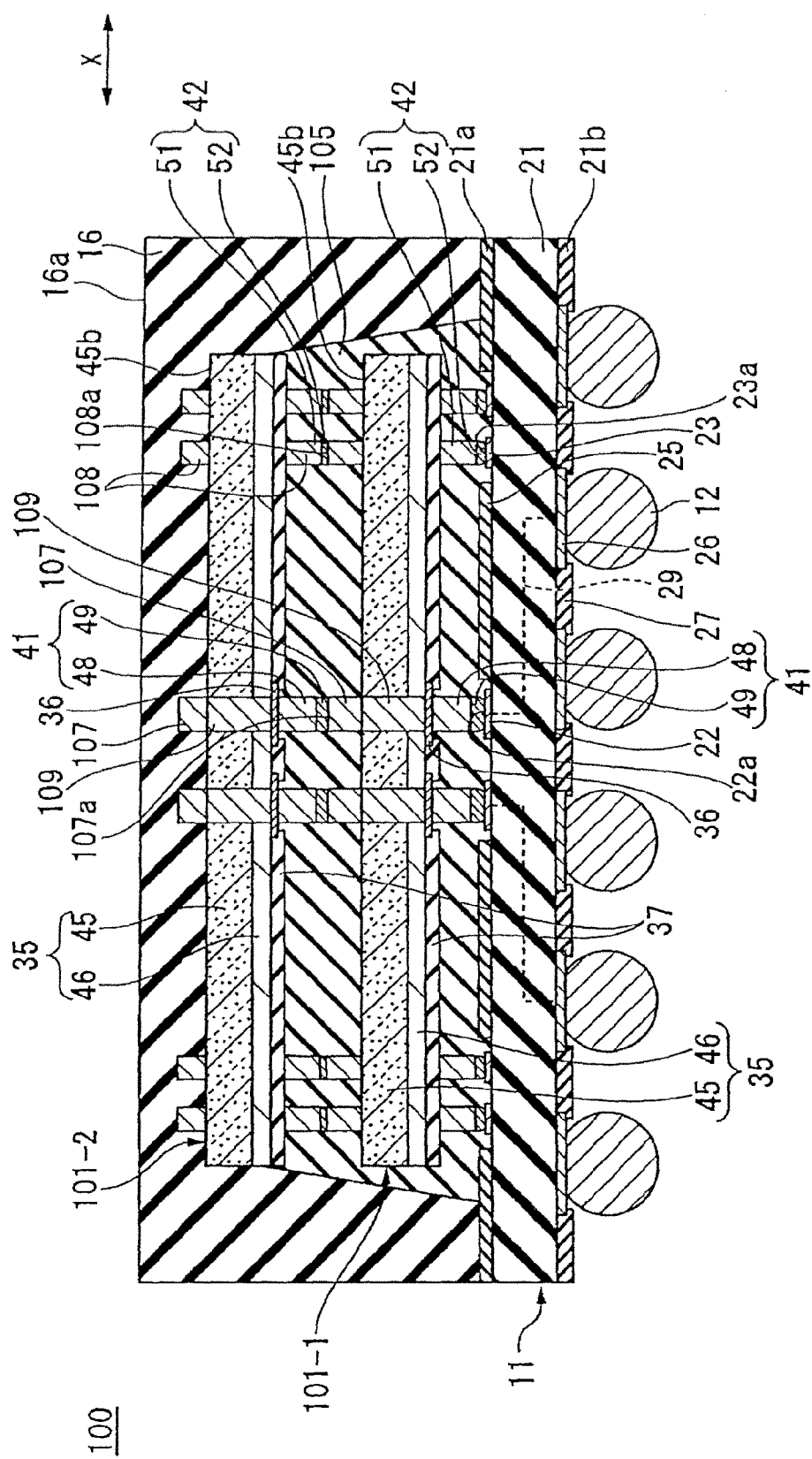
FIG. 18 is a cross-sectional view showing a semiconductor device according to a second embodiment of the present invention.

FIG. 18 is a cross-sectional view showing a semiconductor device according to a second embodiment of the present invention. In FIG. 18, the same components as in the semiconductor device 10 of the first embodiment are denoted by the same reference numerals.

Referring to FIG. 18, a semiconductor device 100 of the second embodiment has the same configuration as the semiconductor device 10 of the first embodiment except that semiconductor chips 101-1 and 101-2 and a first sealing resin 105 are provided instead of the semiconductor chip 14 and the first sealing resin 15 provided in the semiconductor device 10.

Figure 19:
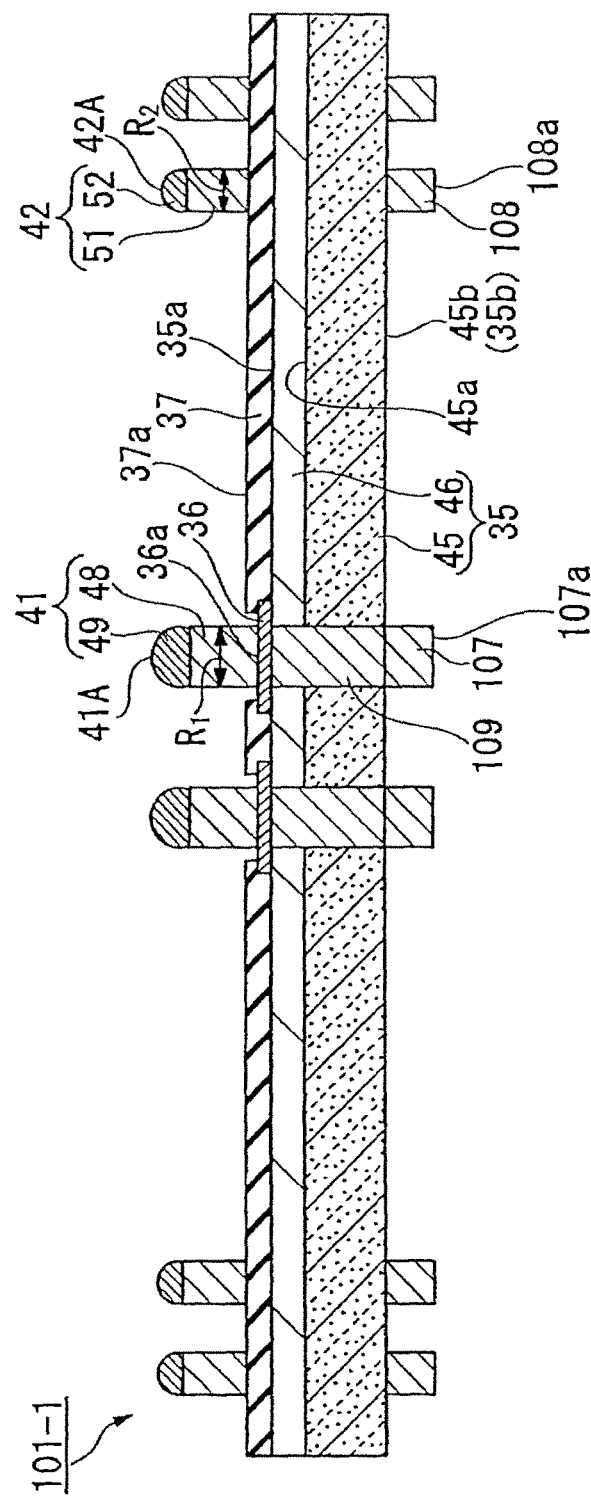
FIG. 19 is a cross-sectional view the lowermost semiconductor chip of semiconductor chips in the semiconductor device according to the second embodiment of the present invention.

FIG. 19 is a cross-sectional view of a semiconductor chip 101-1 located as the lowermost layer of the semiconductor chips of the semiconductor device according to the second embodiment. FIG. 19 shows that the semiconductor chip located as the lowermost layer illustrated in FIG. 18 has been vertically inversed.

Referring to FIG. 19, the semiconductor chip 101-1 has the same configuration as the semiconductor chip 11 except that first rear bumps 107, second rear bumps 108, and through electrodes 109 are added to the configuration of the semiconductor chip 14 described in the first embodiment. The first and second rear bumps 107 and 108 are provided on a second surface 45b of the substrate body 45. The first rear bumps 107 are arranged so that the electrode pads 36 are opposed to the first rear bumps 107. Each of the first rear bumps 107 has a connection surface 107a connected to a first solder layer 49 of the semiconductor chip 101-2 (see FIG. 18). The first rear bumps 107 may have a diameter substantially equal to that of the first bump electrode 41.

The second rear bumps 108 are arranged so that the second bump electrode bodies 51 are opposed to the second rear bumps 108. Each of the second rear bumps 108 has a connection surface 108a connected to a second solder layer 52 of the semiconductor chip 101-2 (see FIG. 18). The second rear bumps 108 may have a diameter substantially equal to that of the second bump electrode 42.

The second rear bumps 108 and the first rear bumps 107 are configured such that the height of the second rear bumps 108 is equal to the height of the first rear bumps 107.

The through electrodes 109 are provided so as to extend through the substrate 35. The through electrodes 109 are electrically connected to circuit devices (not shown) formed in the circuit device layer 46. Each of the through electrodes 109 has a first end connected to the corresponding electrode pad 36 and a second end connected to the corresponding first rear bump 107.

Thus, each of the through electrodes 109 electrically connects the first rear bump 107 and the electrode pad 36 to each other.

Referring to FIG. 18, the semiconductor chip 101-1 thus constructed is mounted on the wiring substrate 11 by flip chip bonding in a state in which the semiconductor chip 101-1 has been inversed vertically from the state shown in FIG. 19.

Thus, the first bump electrodes 41 of the semiconductor chip 101-1 are connected to the first connection pads 22. Furthermore, the second bump electrodes 42 of the semiconductor chip 101-1 are connected to the second connection pads 23.

Referring to FIG. 18, the semiconductor chip 101-2 has a similar configuration to the semiconductor chip 101-1. Specifically, the semiconductor chip 101-2 includes a substrate (a second substrate) 35, electrode pads (second electrode pads) 36, an insulator film (a second insulator film) 37, first bump electrodes (third bump electrodes) 41, second bump electrodes (fourth bump electrodes) 42, first rear bumps (third rear bumps) 107, second rear bumps (fourth rear bumps) 108, and through electrodes 109. The first and second bump electrodes 41 and 42 has first and second solder layers (third and fourth solder layers) 49 and 52 at upper surface side of them.

The semiconductor chip 101-2 is arranged on the semiconductor chip 101-1 so that the first and second solder layers 49 and 52 of the semiconductor chip 101-2 face the semiconductor chip 101-1.

The semiconductor chip 101-2 is mounted on the semiconductor chip 101-1 by flip chip bonding. The first bump electrodes 41 provided on the semiconductor chip 101-2 are connected to the connection surfaces 107a of the first rear bumps 107 provided on the semiconductor chip 101-1.

The second bump electrodes 42 provided on the semiconductor chip 101-2 are connected to the connection surfaces 108a of the second rear bumps 108 provided on the semiconductor chip 101-1. The semiconductor chip 101-2 is electrically connected to the semiconductor chip 101-1 via the first solder layers 49 and also electrically connected to the wiring substrate 11 via the semiconductor chip 101-1.

Thus, the semiconductor chips 101-1 and 101-2 have the first and second bump electrodes 41 and 42. Therefore, when a plurality of semiconductor chips (at least two semiconductor chips 101-1 and 101-2) are stacked and mounted by flip chip bonding, the semiconductor chip 101-2 that is spaced upward from the wiring substrate 11 is not mounted in an inclined state. Accordingly, the reliability of electric connection between a plurality of semiconductor chips (101-1 and 101-2) can be improved.

Referring to FIG. 18, a first sealing resin 105 is provided so that a gap between the wiring substrate 11 and the semiconductor chip 101-1 and a gap between the semiconductor chip 101-1 and the semiconductor chip 101-2 are filled with the first sealing resin 105.

Thus, the first sealing resin 105 reinforces joint portions between the wiring substrate 11 and the semiconductor chip 101-1 and joint portions between the semiconductor chip 101-1 and the semiconductor chip 101-2.

For example, an underfilling resin may be used as the first sealing resin 105.

A second sealing resin 16 is provided on a surface of the wiring substrate 11 so as to seal the stacked semiconductor chips 101-1 and 101-2 and the underfilling resin 105.

According to the semiconductor chip and the semiconductor device of the second embodiment, positional variations in height of the tops 41A and 42A (see FIG. 19) of the first and second bump electrodes 41 and 42 are reduced.

Accordingly, a constricted portion, a void, or the like is prevented from being generated at the first solder layers 49 of the first bump electrodes 41.

Thus, flip chip connection between the first bump electrodes 41 of the semiconductor chip 101-1 and the first connection pads 22 of the wiring substrate 11 (or flip chip connection between the first bump electrodes 41 of the semiconductor chip 101-2 and the rear electrodes 107 of the semiconductor chip 101-1) can be established with accuracy via the first solder layers 49. Therefore, the reliability of electric connection between a plurality of semiconductor chips 101-1 and 101-2 (the reliability of flip chip connection) can be improved. In other words, the capacity of the semiconductor device 100 can readily be increased with improved reliability of the electric connection of the semiconductor device 100.

Furthermore, as the diameter $R_2$ of each of the second bump electrode bodies 51 is made smaller than the diameter $R_1$ of each of the first bump electrode bodies 48, a parasitic capacitance with a chip signal circuit formed in the circuit device layer 46 can be reduced.

In addition, because there is no need to flatten the insulator film 37, the cost for the semiconductor chip 14 is prevented from increasing.

Still furthermore, the aforementioned semiconductor device 100 of the second embodiment can be manufactured by the same process as for the semiconductor device 10 of the first embodiment except for additional steps of forming the rear electrodes 107 and 108 and the through electrodes 109 and mounting the semiconductor chip 101-2 on the semiconductor chip 101-1 by flip chip bonding.

Although preferred embodiments of the present invention have been described in detail, the present invention is not limited to those specific embodiments. It should be understood that various changes and modifications may be made therein without departing from the scope of the present invention defined by the appended claims.

Figure 20:
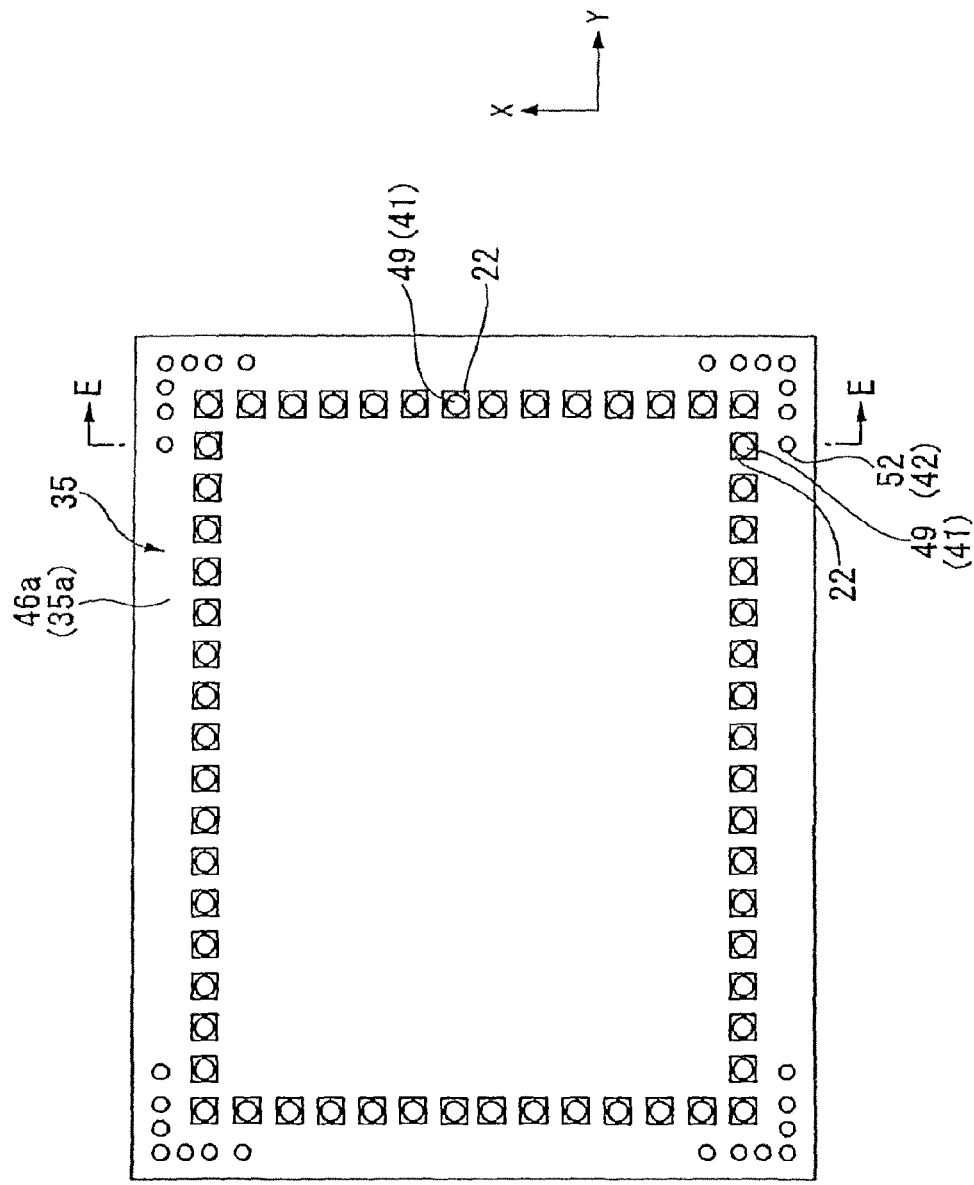
FIG. 20 is a plan view showing a variation of a semiconductor chip.
Figure 21:
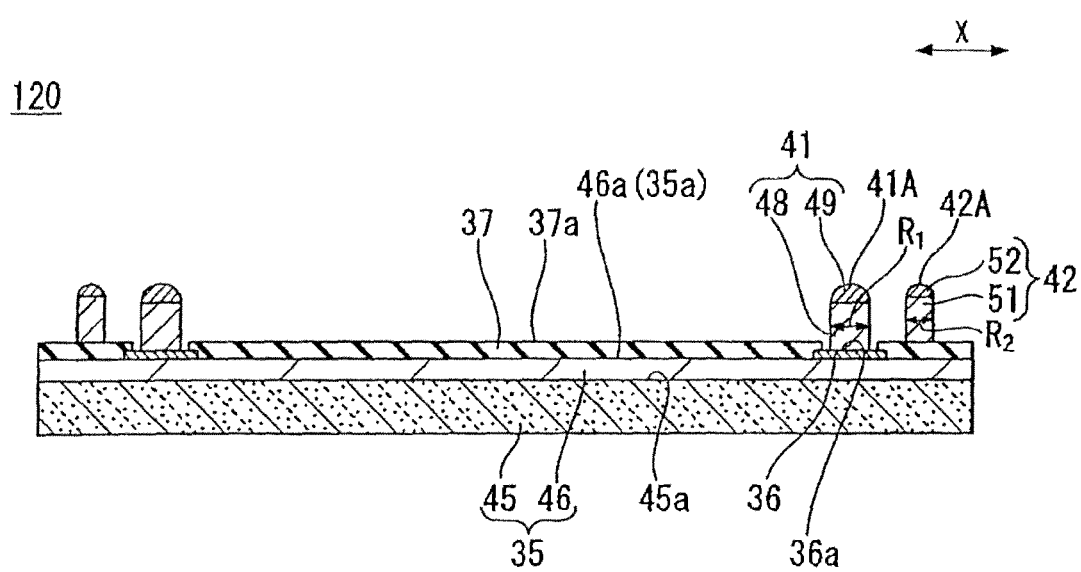
FIG. 21 is a cross-sectional view of the variation of the semiconductor chip taken along line E-E of FIG. 20.

For example, a different configuration for a semiconductor chip may be employed. FIG. 20 is a plan view of a variation of a semiconductor chip, and FIG. 21 is a cross-sectional view of the variation of the semiconductor chip taken along line E-E of FIG. 20. In FIGS. 20 and 21, the same components as in the structure shown FIGS. 2 and 3 and described in the first embodiment are denoted by the same reference numerals.

In the semiconductor chips 14, 101-1, and 101-2 of the first and second embodiments, the first bump electrodes 41 are arranged in rows at a central area of the substrate 35, and the second bump electrodes 42 are arranged at a peripheral area of the substrate 35. However, as in the semiconductor chip 120 shown in FIGS. 20 and 21, the first bump electrodes 41 may be arranged in the form of a frame at a peripheral area of the substrate 35, and the second bump electrodes 42 may be arranged at four corners of the substrate 35 that are located outside of the first bump electrodes 41.

This example also exhibits the same advantageous effects as the semiconductor chip 14 of the first embodiment. Furthermore, the layout of the first and second bump electrodes 41 and 42 illustrated in FIGS. 20 and 21 may be applied to the semiconductor chips 101-1 and 101-2 of the second embodiment.

In other words, the layout of the first and second bump electrodes 41 and 42 of the semiconductor chips 14, 101-1, and 101-2 of the first and second embodiments is not limited to those illustrated in FIGS. 2 and 20.

What is claimed is:

1. A device, comprising:
    a first substrate including a circuit device layer, the first substrate having a first surface;
    a first electrode pad arranged on the first surface of the first substrate;
    a first insulator film provided on the first surface of the first substrate so that the first electrode pad is exposed;
    a first bump electrode provided on the first electrode pad and having a first diameter; and
    a second bump electrode provided atop the first insulator film and having a second diameter smaller than the first diameter.

2. The device as recited in claim 1, wherein the first bump electrode has a first solder layer at a tip side thereof,
    the second bump electrode has a second solder layer at a tip side thereof, and
    the amount of the first solder layer is larger than the amount of the second solder layer.

3. The device as recited in claim 2, wherein each of the first solder layer and the second solder layer has an arc-shaped convex shape due to a surface tension of solder in a melted state, and
    a top of the first solder layer having the arc-shaped convex shape is located at substantially the same height as a top of the second solder layer having the arc-shaped convex shape.

4. The device as recited in claim 2, wherein the first bump electrode includes a first bump electrode body provided on the first electrode pad, the first bump electrode body having a first solder formation surface on which the first solder layer is arranged,
    the second bump electrode includes a second bump electrode body provided on the first insulator film, the second bump electrode body having a second solder formation surface on which the second solder layer is arranged, and
    the first bump electrode body has the first diameter while the second bump electrode body has the second diameter.

5. The device as recited in claim 4, wherein the first bump electrode body and the second bump electrode body are substantially equal to each other in height.

6. The device as recited in claim 2, wherein the amounts of the first and second solder layers depend upon the first and second diameters respectively.

7. The device as recited in claim 1, wherein the first bump electrode is a function bump, and the second bump electrode is a support bump.

8. The device as recited in claim 2, further comprising:
    a first rear bump arranged on a second surface of the first substrate that is opposite to the first surface of the first substrate so that the first electrode pad is opposed to the first rear bump;
    a second rear bump arranged on the second surface of the first substrate so that the second bump electrode is opposed to the second rear bump; and
    a through electrode extending through the first substrate, the through electrode having a first end connected to the electrode pad and a second end connected to the first rear bump.

9. The device as recited in claim 8, wherein the first rear bump and the second rear bump are substantially equal to each other in height.

10. The device as recited in claim 2, further comprising:
    a wiring substrate having a first connection pad connected to the first bump electrode via the first solder layer and a second connection pad connected to the second bump electrode via the second solder layer.

11. The device as recited in claim 8, further comprising:
    a wiring substrate having a first connection pad connected to the first bump electrode via the first solder layer and a second connection pad connected to the second bump electrode via the second solder layer.

12. The device as recited in claim 11, further comprising a semiconductor chip which comprises:
    a second substrate having a third surface;
    a second electrode pad arranged on the third surface of the second substrate;
    a second insulator film provided on the third surface of the second substrate so that the second electrode pad is exposed;
    a third bump electrode provided on the second electrode pad and having a third diameter; and
    a fourth bump electrode provided on the second insulator film and having a fourth diameter smaller than the third diameter,
    wherein the semiconductor chip is stacked over the first substrate so that the third bump electrode is connected to the first rear bump and the fourth bump electrode is connected to the second rear bump.

13. The device as recited in claim 12, wherein the third bump electrode has a third solder layer at a tip side thereof to be connected to the first rear bump,
    the fourth bump electrode has a fourth solder layer at a tip side thereof to be connected to the second rear hump,
    the amount of the third solder layer is larger than the amount of the fourth solder layer.

14. A device, comprising:
    a first substrate including a first surface and first and second pads provided on the first surface;
    a second substrate including a circuit device layer, he second substrate including a second surface, and the second substrate being mounted over the first surface of the first substrate so that the second surface faces to the first substrate;
    a plurality of electrode pads provided on the second surface of the second substrate;
    an insulating layer covering the second surface so that the electrode pads are exposed from the insulating layer;
    a plurality of first bumps provided on the electrode pads and having a first diameter, and the first bumps being electrically coupled to the first pads of the first substrate; and
    a plurality of second bumps provided atop the insulating layer and having a second diameter that is smaller than the first diameter, the second bumps being electrically coupled to the second pads of the first substrate.

15. The device as recited in claim 14, wherein each of the first bumps includes a first solder layer at a tip side thereof,
    each of the second bumps includes a second solder layer at a tip side thereof, and
    the amount of the first solder layer is larger than that of the second solder layer.

16. The device as recited in claim 14, wherein:
    each of the first bumps is electrically coupled to the circuit device layer of the second substrate, and
    each of the second bumps is electrically isolated from the circuit device layer of the second substrate.

* * * * *